(12) United States Patent
Fu et al.

(10) Patent No.: US 9,335,386 B2
(45) Date of Patent: May 10, 2016

(54) MAGNATORESISTIVE COMPONENT AND MAGNATORESISTIVE DEVICE

(71) Applicant: Voltafield Technology Corp., Zhubei, Hsinchu County (TW)

(72) Inventors: Nai-Chung Fu, Zhongli (TW); Kuang-Ching Chen, Changhua County (TW); Fu-Tai Liou, Zhubei (TW)

(73) Assignee: Voltafield Technology Corp., Zhubei (TW)

( * ) Notice: Subject to any disclaimer, the term of this patent is extended or adjusted under 35 U.S.C. 154(b) by 86 days.

(21) Appl. No.: 14/262,911

(22) Filed: Apr. 28, 2014

(65) Prior Publication Data

US 2014/0232390 A1 Aug. 21, 2014

Related U.S. Application Data

(63) Continuation-in-part of application No. 13/625,009, filed on Sep. 24, 2012, now Pat. No. 8,749,232.

(30) Foreign Application Priority Data

Sep. 29, 2011 (TW) .............................. 100135263 A
Sep. 4, 2012 (TW) .............................. 101132202 A

(51) Int. Cl.
*G01R 33/02* (2006.01)
*G01R 33/09* (2006.01)

(52) U.S. Cl.
CPC .............. *G01R 33/093* (2013.01); *G01R 33/09* (2013.01); *G01R 33/096* (2013.01)

(58) Field of Classification Search
CPC ............................. G01R 33/09; G01R 33/093
USPC ........................................................... 324/252
See application file for complete search history.

(56) References Cited

U.S. PATENT DOCUMENTS

| | | | |
|---|---|---|---|
| 4,580,175 A | 4/1986 | Mowry et al. | |
| 5,521,501 A * | 5/1996 | Dettmann et al. | 324/252 |
| 5,561,368 A | 10/1996 | Dovek et al. | |
| 6,174,737 B1 | 1/2001 | Durlam et al. | |
| 2004/0137681 A1 | 7/2004 | Motoyoshi | |
| 2006/0202291 A1* | 9/2006 | Kolb et al. | 257/421 |
| 2006/0202692 A1* | 9/2006 | Tatschl et al. | 324/252 |
| 2009/0128282 A1* | 5/2009 | Zimmer et al. | 338/32 R |
| 2011/0163746 A1 | 7/2011 | Zimmer et al. | |
| 2011/0244599 A1 | 10/2011 | Whig et al. | |

FOREIGN PATENT DOCUMENTS

TW               331592       5/1998

* cited by examiner

*Primary Examiner* — Reena Aurora
(74) *Attorney, Agent, or Firm* — Alan D. Kamrath; Kamrath IP Lawfirm, P.A.

(57) ABSTRACT

A magnetoresistive component comprises a horizontal magnetoresistive layer and a nonparallel magnetoresistive layer. The horizontal magnetoresistive layer is disposed above a surface of a substrate and has a first side and a second side opposite the first side, along its extending direction. The nonparallel magnetoresistive layer is not parallel to the surface of the substrate and is physically connected to the horizontal magnetoresistive layer at the first side of the horizontal magnetoresistive layer.

23 Claims, 21 Drawing Sheets

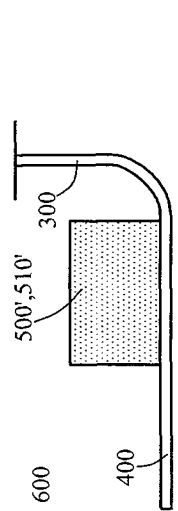
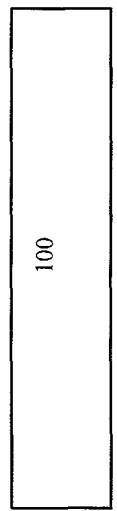
FIG. 4A
FIG. 4B
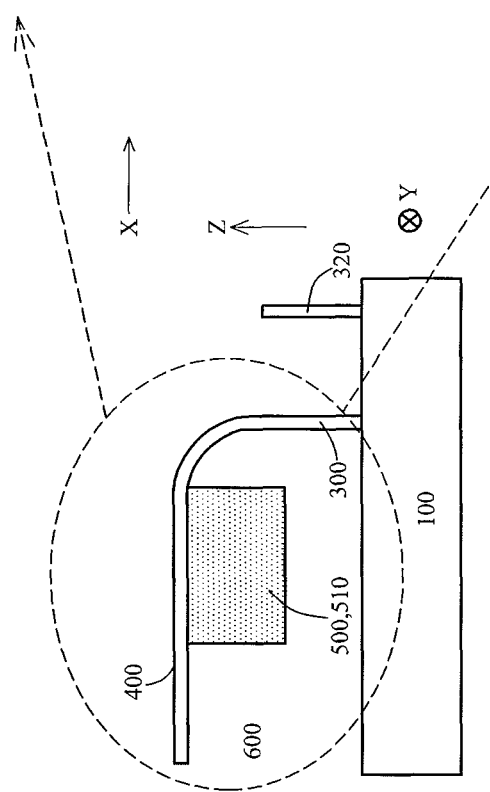
FIG. 4

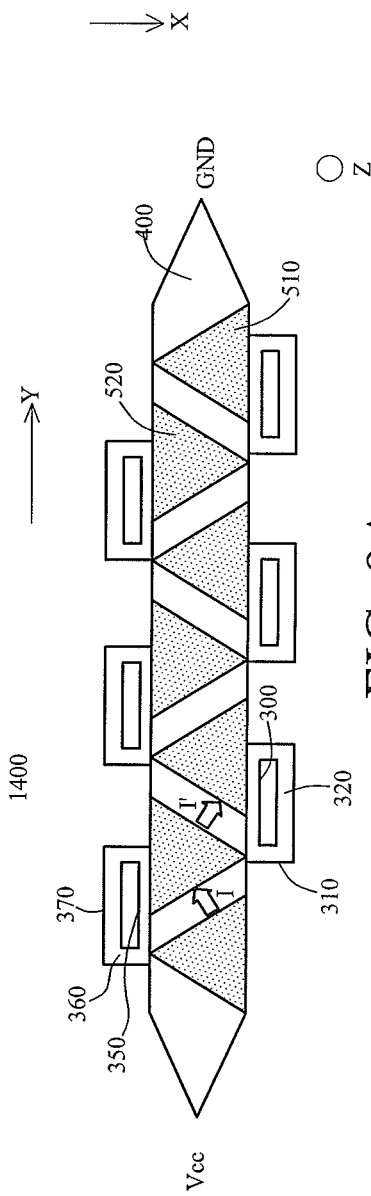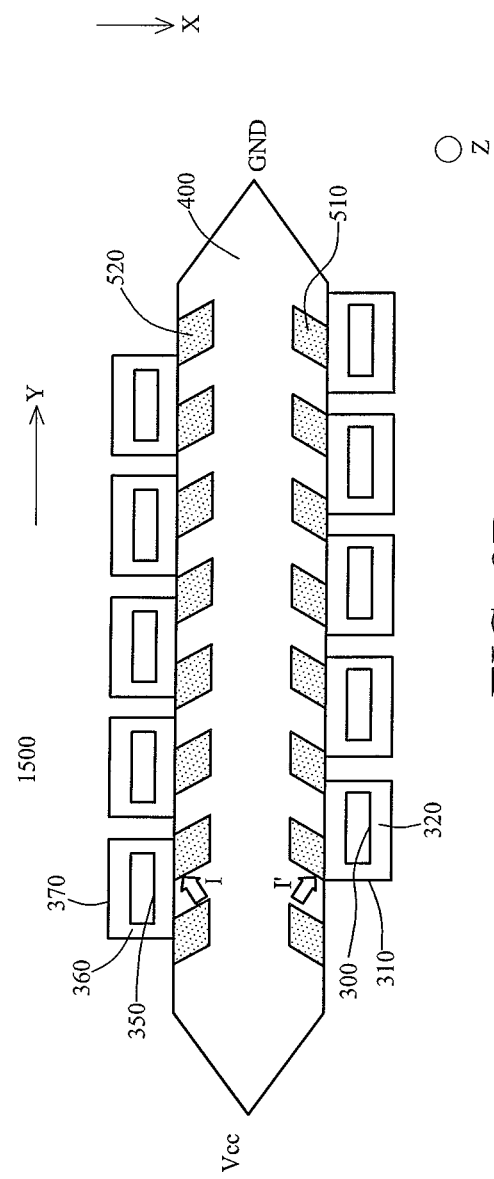
FIG. 9A
FIG. 9B

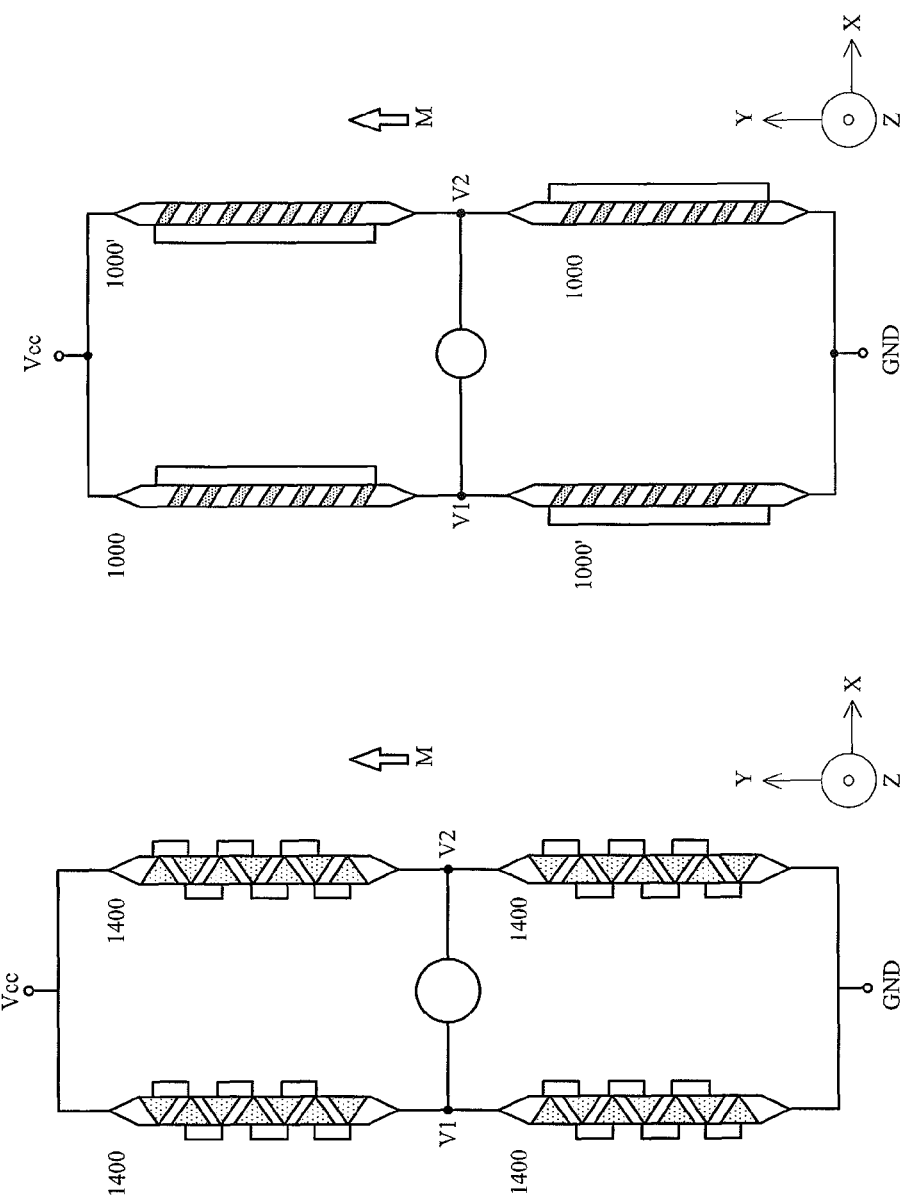

MAGNATORESISTIVE COMPONENT AND MAGNATORESISTIVE DEVICE

BACKGROUND OF THE INVENTION

1. Field of Invention

The present invention relates to a magnetoresistive component, particularly to a magnetoresistive component comprising a horizontal magnetoresistive layer substantially parallel to a surface of a substrate and a nonparallel magnetoresistive layer not parallel to the surface of the substrate.

2. Description of Related Art

The magnetoresistive materials used in a magnetoresistive sensing component would change its resistance according to a change of an external magnetic field. This kind of material is popular for sport equipments, automobile, motors and communication products. Common magnetoresistive materials can be categorized into anisotropic magnetoresistive material (AMR), giant magnetoresistive material (GMR) and tunneling magnetoresistive material (TMR) according to how they function and their sensitivities.

So far a magnetoresistive sensing device capable of sensing changes of X-axis, Y-axis and/or Z-axis magnetic fields still requires improvements regarding their cost, size, package complexity and performance.

SUMMARY OF THE INVENTION

The object of this invention is to provide a magnetoresistive component capable of being used in all xMR devices. This magnetoresistive component provides better performance compared to conventional magnetoresistive components by adopting a nonparallel magnetoresistive layer in combination of a horizontal magnetoresistive layer.

The present invention provides a magnetoresistive component comprising a horizontal magnetoresistive layer and a nonparallel magnetoresistive layer. The horizontal magnetoresistive layer is disposed above a surface of a substrate and has a first side and a second side opposite the first side along its extending direction. The nonparallel magnetoresistive layer is not parallel to the surface of the substrate and is physically connected to the horizontal magnetoresistive layer at the first side of the horizontal magnetoresistive layer.

In one embodiment of the present invention, the nonparallel magnetoresistive layer is disposed on a sidewall of a downward or upward trench and extends downwards or upwards from the first side of the horizontal magnetoresistive layer.

In one embodiment of the present invention, the sidewall of the downward or upward trench forms an angle equal to or less than 90 degree with respect to the surface of the substrate.

In one embodiment of the present invention, the magnetoresistive components further comprises a corner portion composed of a part of the horizontal magnetoresistive layer and a part of the nonparallel magnetoresistive layer.

In one embodiment of the present invention, the corner portion is rounded or comprises multiple facets.

In one embodiment of the present invention, a bottom of the downward trench is covered partially or completely by a bottom magnetoresistive layer.

In one embodiment of the present invention, a shape of the upward or downward trench viewed in top view is oval shape, rectangular shape with rounded corners or rectangular shape with jagged sides.

In one embodiment of the present invention, the thickness of at least a portion of the nonparallel magnetoresistive layer on the sidewall of the downward or upward trench is thicker than that of the horizontal magnetoresistive layer.

The present invention also provides a xMR device comprising the magnetoresistive component of the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 shows the schematic cross section views taken along lines A-A', B-B' and D-D' of FIG. 1, FIG. 2 and FIG. 3 respectively.

FIG. 4A shows another embodiment of the cross section shown in FIG. 4.

FIG. 4B shows another embodiment of the cross section shown in FIG. 4.

FIGS. 9A-9C show the top views of the Z-axis magnetoresistive sensing components according to other embodiments of the present invention.

FIGS. 10A-10B show the Z-axis magnetoresistive sensing devices according to embodiments of the present invention, wherein the Z-axis magnetoresistive sensing devices comprise a Wheatstone bridge structure comprising the Z-axis magnetoresistive sensing components according to embodiments of the present invention.

FIG. 12B* shows another embodiment of the corner portion C which has a concave profile.

DESCRIPTION OF EMBODIMENTS

Figure 1:
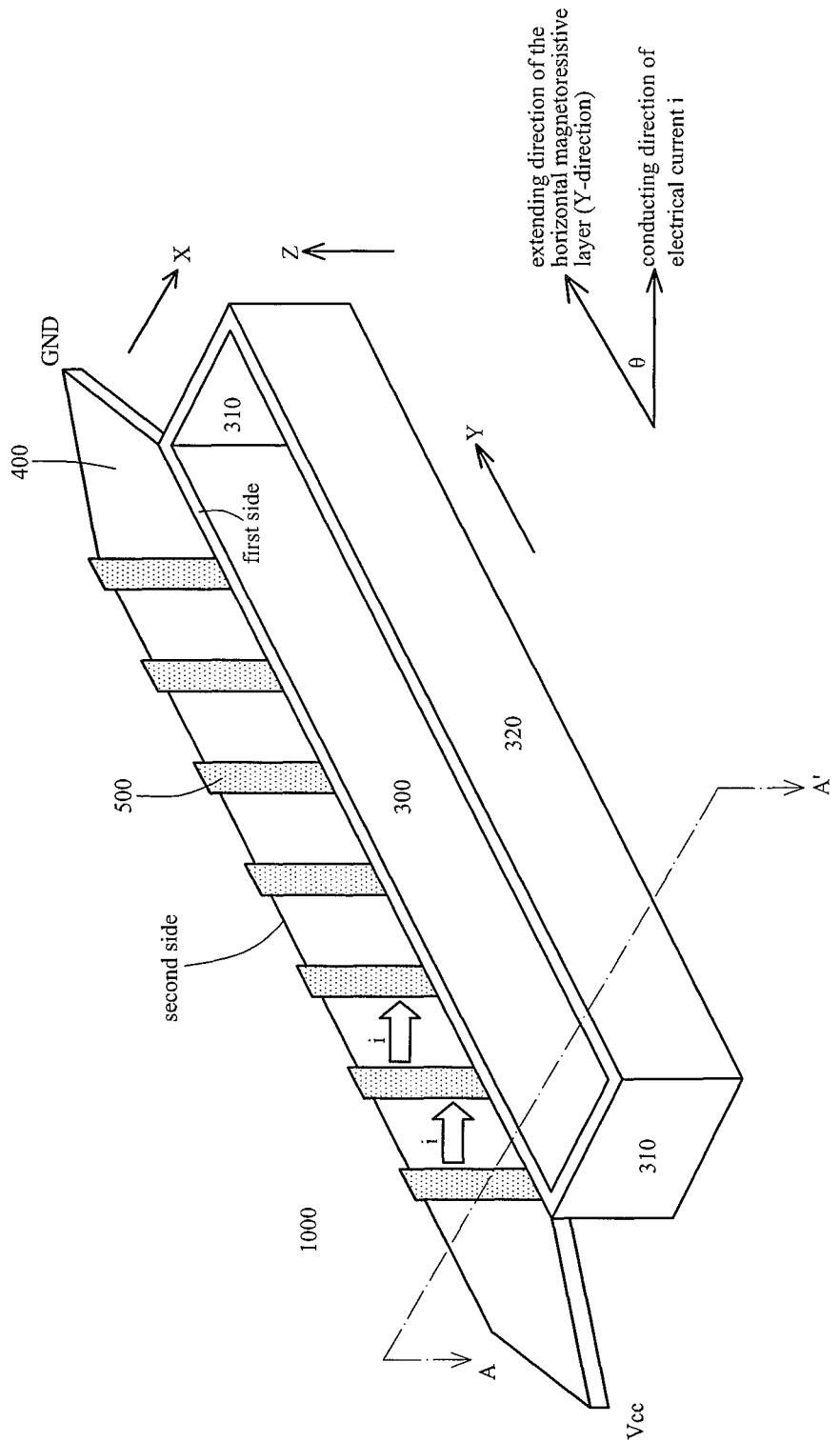
FIG. 1 shows the schematic three-dimensional view of the Z-axis magnetoresistive sensing component according to one embodiment of the present invention.

The present invention focuses on a magnetoresistive sensing component and a magnetoresistive sensing device, particularly the magnetoresistive sensing device capable of sensing an external magnetic field perpendicular to the substrate surface. However, the magnetoresistive sensing device of the present invention may further comprise other common structures such as set/reset circuit, magnetoresistive sensing components capable of sensing X-axis and/or Y-axis magnetic field, various kinds of circuitries such as amplifier, filter, converter . . . etc., shield for shielding unwanted electrical and/or magnetical signals. To explain the present invention clearly and completely without obscurity, the commonly used structures are simply put without detailed descriptions. It is noted that the magnetoresistive sensing device of the present invention can optionally adopt these structures.

The following descriptions illustrate preferred embodiments of the present invention in detail. All the components, sub-portions, structures, materials and arrangements therein can be arbitrarily combined in any sequence despite their belonging to different embodiments and having different sequence originally. All these combinations are falling into the scope of the present invention. A person of ordinary skills in the art, upon reading the present invention, can change and modify these components, sub-portions, structures, materials and arrangements therein without departing from the spirits and scope of the present invention. These changes and modifications should fall in the scope of the present invention defined by the appended claims.

There are a lot of embodiments and figures within this application. To avoid confusions, similar components are designated by the same or similar numbers. To simplify figures, repetitive components are only marked once. The purpose of figures is to convey concepts and spirits of the present invention, so all the distances, sizes, scales, shapes and connections are explanatory and exemplary but not realistic. Other distances, sizes, scales, shapes and connections that can achieve the same functions or results in the same way can be adopted as equivalents.

In the context of the present invention, "magnetic-field-sensing layer" or "magnetic-field-guiding layer" is composed by magnetic materials and "magnetoresistive layer" is also composed by magnetic materials, especially discrete or continuous single layer or multiple layers whose resistance would change according to a change of an external magnetic field. For example, the magnetic material may comprise an anisotropic magnetoresistive material (AMR), a giant magnetoresistive material (GMR) and a tunneling magnetoresistive material (TMR), a ferromagnet material, an antiferromagnet material, a nonferromagnet material or a tunneling oxide or any combination thereof. "Magnetic-field-sensing layer" or "magnetoresistive layer" or "magnetic-field-guiding layer" preferably comprises anisotropic magnetoresistive material (AMR) especially Permalloy. In the context of the present invention, the descriptive term "sensing" or "guiding" added before elements is used to explain certain function/effect performed/achieved by such elements when the magnetoresistive sensing component senses an external magnetic field of a specific direction. When a change occurs to the direction of the external magnetic field (for example becoming opposite direction), the function/effect performed/achieved by such elements may change or switch. Therefore, the descriptive term "sensing" or "guiding" added before elements should not limit the function/effect of such elements. In the context of the present invention, the term "conductive strips", "conductive part" or "interconnect" represents a conductive structure with any shape capable of conducting electricity. It may comprise a metal, an alloy, a silicide, nanotubes, a conductive carbon material, doped silicon. As its structure, it may take a form of strip, concrete islands, sheet, via, single damascene or dual damascene structures, or a combination thereof along horizontal or vertical direction. In the context of the present invention, the term "magnetic field" or "magnetic field of a specific direction" represents a net magnetic field at a specific location taking effect of magnetic fields from different sources or a magnetic field at a specific location from a specific source without considering other sources or a magnetic component of a specific direction. In the context of the present invention, the phrase "A is magnetically coupled to B" means magnetic flux lines going through one of A and B would be affected by the other of A and B, thereby redirecting or concentrating the magnetic flux lines. Therefore, the phrase "A is magnetically coupled to B" can represent a situation where A is in physical contact with B or a situation where A and B are close enough to magnetically affect each other without physically contacting each other. In the context of the present invention, the phrase "A is electrically coupled to B" means electrical current can flow from one of A and B to the other of A and B, so "A is electrically coupled to B" can represent a situation where A is in physical contact with B or a situation where there is one or more conductive structure/substance between A and B so as to make electrical communication occurs between A and B.

Now please refer to FIG. 1 and FIG. 4. FIG. 1 shows the schematic three-dimensional view of the Z-axis magnetoresistive sensing component according to one embodiment of the present invention. FIG. 4 shows the schematic cross section views taken along lines A-A' of FIG. 1. FIG. 1 focuses on the shape and orientation of each element of Z-axis magnetoresistive sensing component 1000. FIG. 4-4B focus on the primary elements involved in sensing an external magnetic field of Z-direction (hereafter it is referred to as Z-axis magnetic field). Z-axis magnetoresistive sensing component 1000 primarily comprises a horizontal magnetoresistive layer 400, a magnetic-field-sensing layer 300 not parallel to a surface of the substrate and a conductive part 500. The strip of horizontal magnetoresistive layer 400 is disposed above the surface of the substrate 100 and parallel thereto. The strip of horizontal magnetoresistive layer 400 extends along the direction of Y (hereafter it is referred to as Y-direction) and takes a form of long narrow thin sheet without limitations on the shape of its ends. The horizontal magnetoresistive layer 400 along its extending direction (Y direction) has two long sides, first side close to the direction of +X (hereafter it is referred to as X-direction) and a second side opposite to the first side. One end of the strip of horizontal magnetoresistive layer 400 is electrically coupled to working voltage (Vcc) and the other end is electrically coupled to ground (GND). The magneticfield-sensing layer 300 not parallel to the substrate surface is also disposed above the substrate and almost perpendicular to the substrate surface. The magnetic-field-sensing layer 300 can be designed to be a slant or a combination of multiple slants, that is, not parallel to the substrate surface. Even though FIG. 1 takes vertical as example, the present invention is not limited thereto. The magnetic-field-sensing layer 300 extends downwards from the first side of the horizontal magnetoresistive layer 400 and magnetically coupled thereto, so as to redirect/guide the Z-axis magnetic field felt by the horizontal magnetoresistive layer 400 to the magnetic-field-sensing layer 300. This would cause a change of the resistance of the Z-axis magnetoresistive sensing component 1000, resulting in a change of the output voltage. The horizontal magnetoresistive layer 400 and magnetic-field-sensing layer 300 may be formed from the same magnetoresistive material in one structure, or may be formed from the same or different magnetoresistive materials separately into physically connected separate structures, or may be formed from the same or different magnetoresistive materials separately into physically separated discrete structures. When same material is used, different thicknesses can be adopted according to design requirements. The horizontal magnetoresistive layer 400 and magnetic-field-sensing layer 300 can be physically separated as long as they are close enough to magnetically affect each other. In this embodiment, the magnetic-field-sensing layer 300 takes a form of a portion of a magnetoresistive layer on the sidewall of a downward trench and this makes it a long thin strip. The rest of the magnetoresistive layer on the sidewall of the downward trench comprises two connecting magnetoresistive layers 310 physically connected to the magnetic-field-sensing layer 300 and a opposite magnetoresistive layer 320 physically connected to the two connecting magnetoresistive layers 310. Nonetheless, connecting magnetoresistive layer 310 and opposite magnetoresistive layer 320 do not contribute to Z-axis magnetic field sensing, they are not discussed further.

The conductive part 500 is disposed above or below the horizontal magnetoresistive layer 400 to electrically or physically contact the horizontal magnetoresistive layer 400. The extending direction of the conductive part 500 is not parallel to the extending direction of the horizontal magnetoresistive layer 400. Therefore, the conductive part 500 serves as a shunt to change a direction of the current flowing in the magnetoresistive layer (thereafter "direction of the current" is referred to as "current direction"), so the current direction in the magnetoresistive layer forms an angle with respect to a direction of the magnetization of the magnetoresistive layer (thereafter "direction of the magnetization" is referred to "magnetization direction"), thereby increasing sensitivity of the magnetoresistive layer. In this embodiment, multiple conductive parts 500 have the same width, have the same distance between the adjacent ones, and all form an acute angle with respect to the extending direction of the horizontal magnetoresistive layer 400 (Y-direction). Preferably, the extending direction of the conductive parts 500 forms 45 degree angle with respect to the extending direction of the horizontal magnetoresistive layer 400 (Y-direction). Since the conductive part 500 adopts one or more conductive metals as its material, its resistivity is far smaller than the resistivity of the magnetoresistive material adopted by the horizontal magnetoresistive layer 400. Hence, in the area where the conductive part 500 is in physical contact with the horizontal magnetoresistive layer 400 electrical current would take the conductive part 500 with smaller resistivity as its conducting path; within the horizontal magnetoresistive layer 400 (that is the area between adjacent conductive parts 500) electrical current i would take the shortest distance between the adjacent conductive parts 500 as its conducting path. The horizontal magnetoresistive layer 400 and the conductive part 500 together form a conducting path: the horizontal magnetoresistive layer 400→the conductive part 500→the horizontal magnetoresistive layer 400 between adjacent conductive parts 500→the next conductive part 500 . . . . Since multiple conductive parts 500 have the same shape, the same width, the same orientation and have the same distance between the adjacent ones, the electrical currents between the adjacent conductive parts 500 flow along the same direction and this conducting direction forms an angle θ with respect to the extending direction of the horizontal magnetoresistive layer 400 (Y-direction).

In FIG. 4, the horizontal magnetoresistive layer 400, conductive part 500, magnetic-field-sensing layer 300 and opposite magnetoresistive layer 320 are all disposed within the dielectric layer 600 above the substrate 100, but in the final product there may be other dielectric layers covering the horizontal magnetoresistive layer 400 and protecting other elements or circuitry. The dielectric layer 600 may be a single or multiple films of any dielectric materials. Also, although in FIG. 4 the magnetic-field-sensing layer 300 is shown to be in physical contact with the substrate 100, it is noted that the substrate shown in all the figures of the present invention may comprise a base substrate and all the active devices, passive devices, circuitry, doped region, interconnects between the base substrate and Z-axis magnetoresistive sensing components. The term "substrate" is not limited to the well known glass, silicon or plastic carriers. The descriptions of dielectric layer 600 and substrate 100 can be equally applied to FIGS. 4A, 4B, 5, 7A, 7B, 8A, 8B, the descriptions are omitted in the following content to save repetitions.

Then please refer to FIG. 4A. FIG. 4A shows another embodiment of the cross section shown in FIG. 4. The difference between FIG. 4A and FIG. 4 is that the conductive parts 500' of FIG. 4A are rather disposed above the horizontal magnetoresistive layer 400 than below the horizontal magnetoresistive layer 400 and magnetic-field-sensing layer 300' of FIG. 4A rather extends upwards from the first side of the horizontal magnetoresistive layer 400 than downwards. The horizontal magnetoresistive layer 400 and magnetic-field-sensing layer 300' of FIG. 4A may be at the bottom and sidewall of a trench respectively, but they may have other layouts achieved by other fabricating processes.

Then please refer to FIG. 4B. FIG. 4B also shows another embodiment of the cross section shown in FIG. 4. The difference between FIG. 4B and FIG. 4 is that in FIG. 4B the horizontal magnetoresistive layer 400 and magnetic-field-sensing layer 300 are not physical connected at the original turning/joining corner. This can be caused by various reasons such as special design concern, the magnetoresistive material suffering from thinner thickness at turning corner due to poor deposition process, misalignment due to poor lithography process, or over etching the turning corner. Even though the horizontal magnetoresistive layer 400 and magnetic-field-sensing layer 300 are no longer physically connected together, they should be close enough in position to render magnetic influence to each, thereby keeping the Z-axis magnetoresistive sensing component operate properly.

Although in this spec the inventors provide modified embodiments, FIG. 4A and FIG. 4B, only for the cross section view of FIG. 4, it is noted that the modified embodiments, FIG. 4A and FIG. 4B, can be equally applied to the first side or second side of all the Z-axis magnetoresistive sensing components 1000', 1200, 1300, 1400, 1500, 1600 of the present invention. The horizontal magnetoresistive layer 400, magnetic-field-sensing layer 300/300', conductive part 500/

500' and conductive part 510/510' (to be explained later) can be combined in any way and any other. For example: conductive part 500'/510' of FIG. 4A may be disposed below the horizontal magnetoresistive layer 400; conductive part 500/510 may be disposed above the horizontal magnetoresistive layer 400; the horizontal magnetoresistive layer 400 and magnetic-field-sensing layer 300 of FIG. 4A may be physically separated. Also, although the magnetic-field-sensing layer 300/300' and horizontal magnetoresistive layer 400 shown in FIGS. 4, 4A and 4B have uniform thickness, it is possible the magnetic-field-sensing layer 300/300' and horizontal magnetoresistive layer 400 may have different thicknesses and/or materials and the thickness of magnetic-field-sensing layer 300/300' may along vertical direction to optimize performances of the components.

Figure 2:
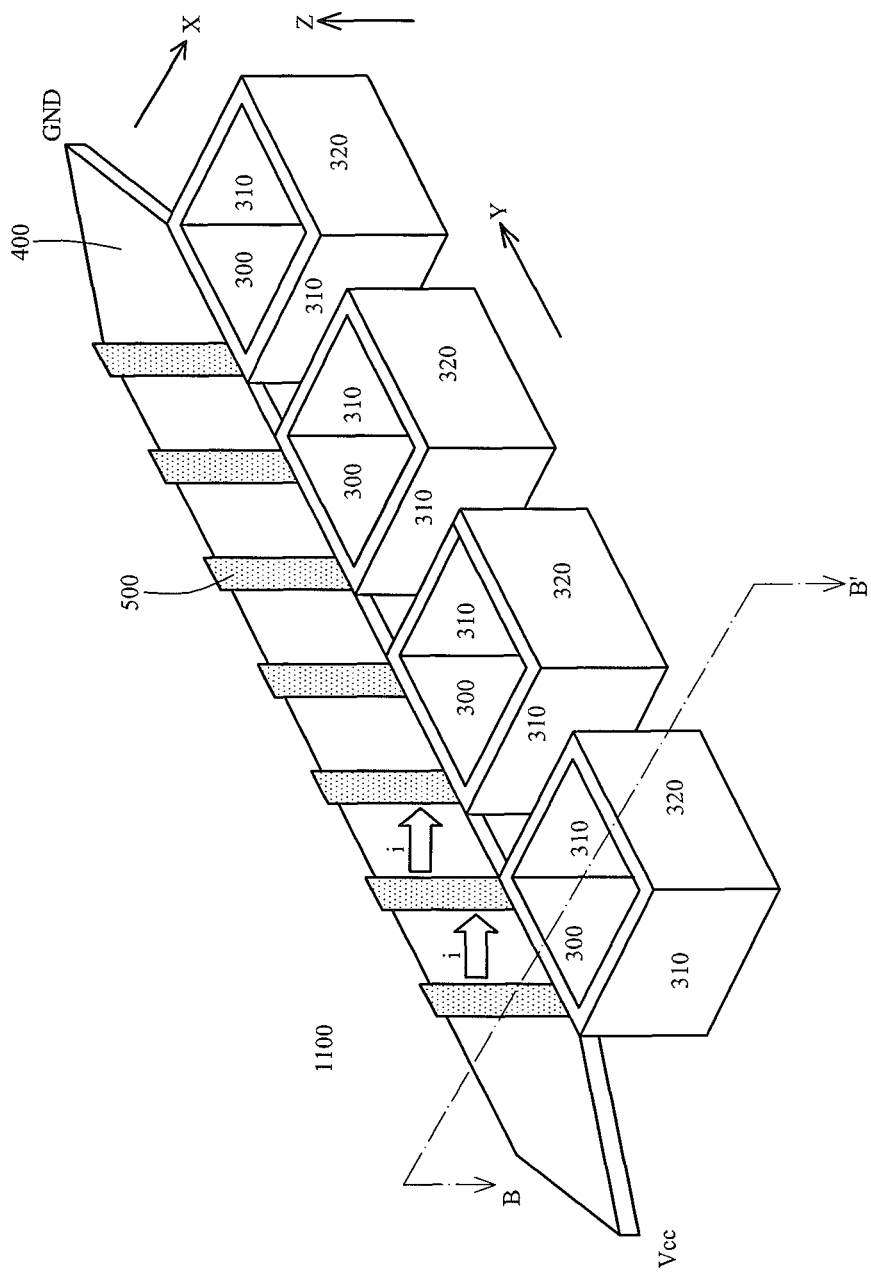
FIG. 2 shows the schematic three-dimensional view of the Z-axis magnetoresistive sensing component according to another embodiment of the present invention.

Then please refer to FIG. 2. FIG. 2 shows the schematic three-dimensional view of the Z-axis magnetoresistive sensing component 1100 according to another embodiment of the present invention. Z-axis magnetoresistive sensing component 1100 shares the same operational principle with Z-axis magnetoresistive sensing component 1000 of FIG. 1 and the cross section view taken along line B-B' is the same one shown in FIG. 4. The shapes, materials, orientations, relative positions of the horizontal magnetoresistive layer 400 and conductive part 500 and conducting path and direction of the electrical current are the same for Z-axis magnetoresistive sensing component 1100 and 1000, so here only the differences are addressed. In this embodiment, the magnetic-field-sensing layer 300 is almost perpendicular to the substrate surface and extends downwards from the first side of the horizontal magnetoresistive layer 400. The magnetic-field-sensing layer 300 comprises multiple discrete sub-portions and each sub-portion takes a form of a portion of a magnetoresistive layer on the sidewall of a downward trench, so there are multiple downward trenches accommodate the multiple discrete sub-portions of the magnetic-field-sensing layer 300 respectively. The rest of the magnetoresistive layer on the sidewall of each downward trench comprises two connecting magnetoresistive layers 310 physically connected to the magnetic-field-sensing layer 300 and a opposite magnetoresistive layer 320 physically connected to the two connecting magnetoresistive layers 310. Nonetheless, connecting magnetoresistive layer 310 and opposite magnetoresistive layer 320 do not contribute to Z-axis magnetic field sensing, they are not discussed further. Preferably, each downward trench has the same size, depth, sidewall slope, so each discrete sub-portion of the magnetic-field-sensing layer 300 has approximately the same area and thickness. Preferably, the distances between the adjacent downward trenches are the same. The magnetic-field-sensing layer 300 of this invention looks different from the magnetic-field-sensing layer 300 of FIG. 1, however the material (same as the horizontal magnetoresistive layer 400 or different from the horizontal magnetoresistive layer 400), the way of coupling to the horizontal magnetoresistive layer 400 (magnetically coupled) and operational principle (feeling Z-axis magnetic field and redirect/guide it to the horizontal magnetoresistive layer 400) for the magnetic-field-sensing layer 300 of this embodiment is basically the same as the one in FIG. 1.

Figure 3:
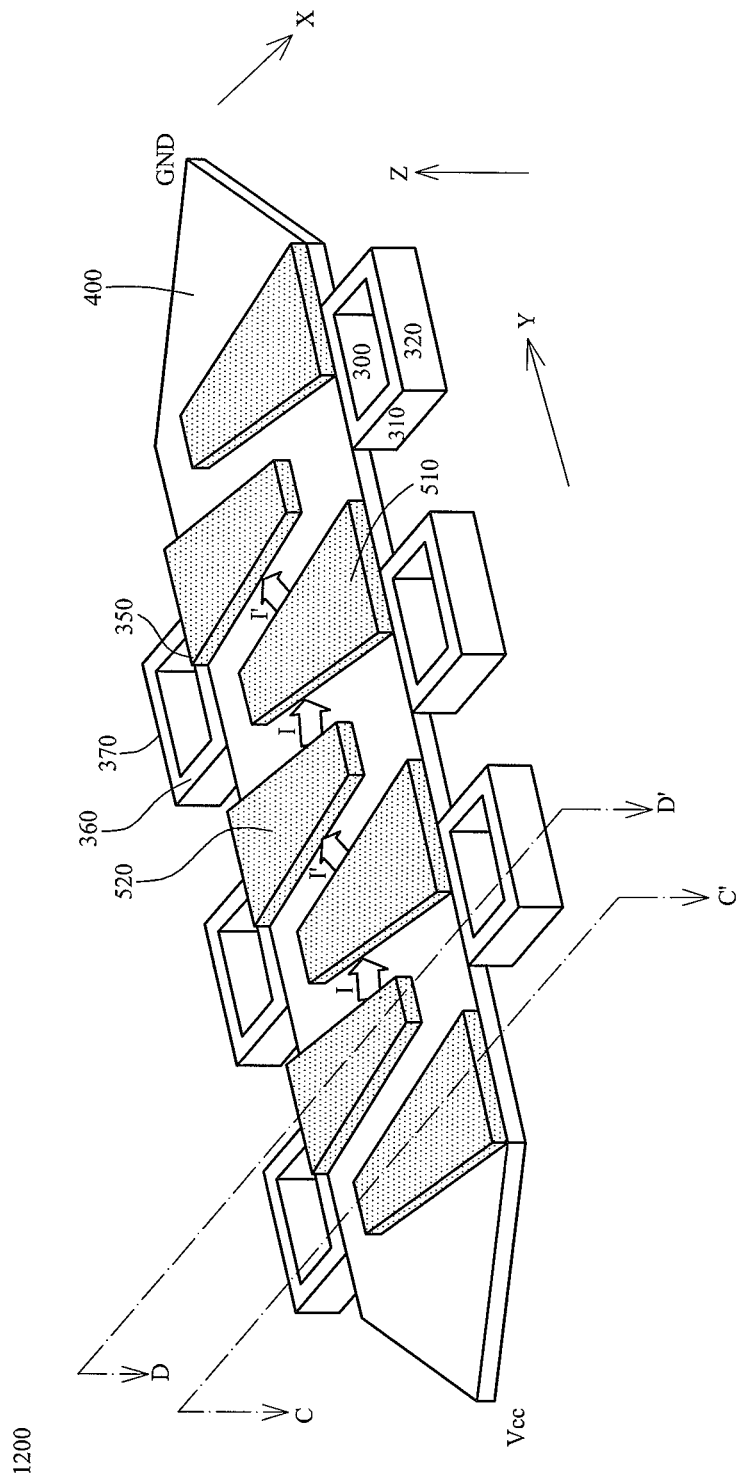
FIG. 3 shows the schematic three-dimensional view of the Z-axis magnetoresistive sensing component according to another embodiment of the present invention.
Figure 3A:
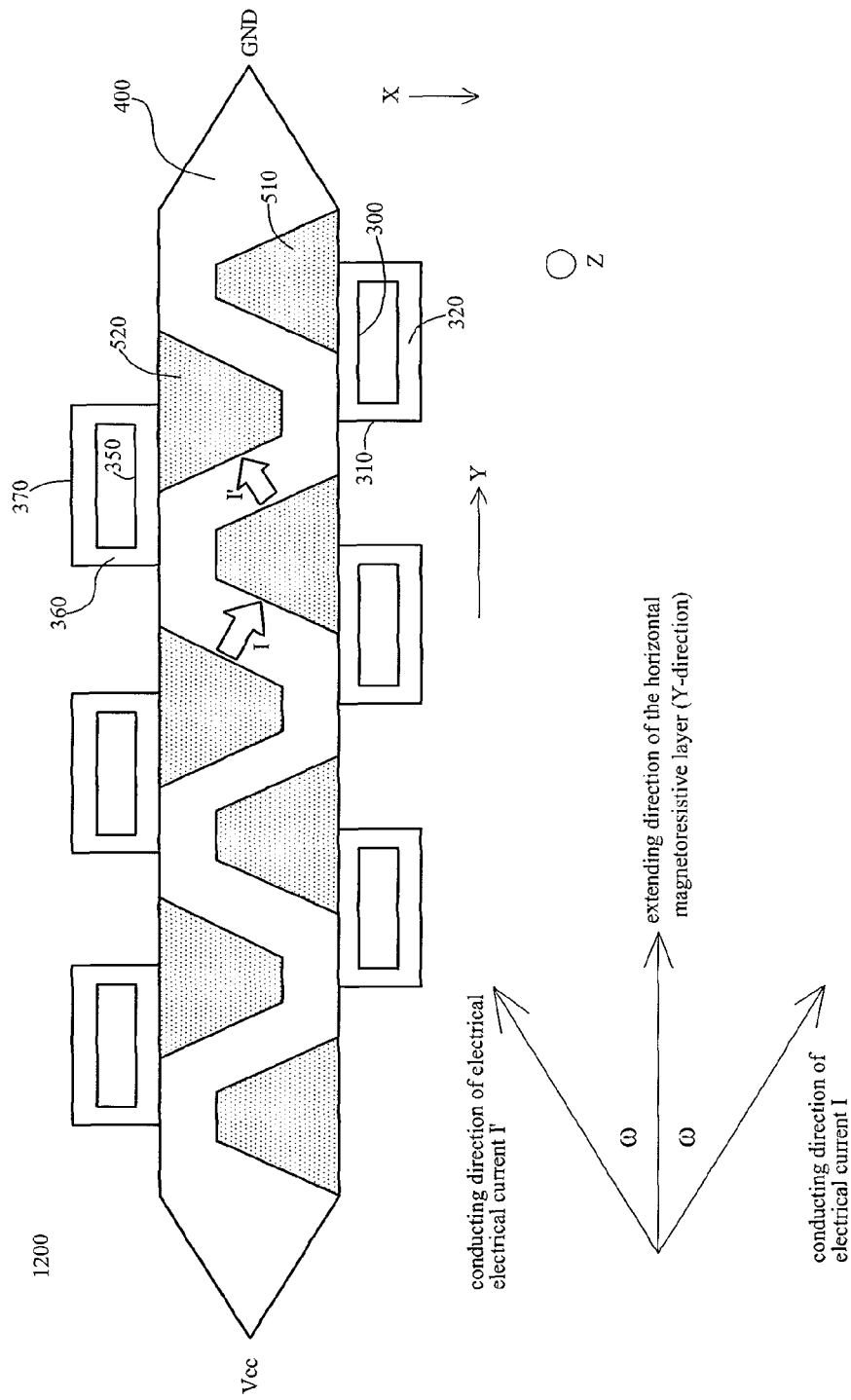
FIG. 3A shows the top view of the Z-axis magnetoresistive sensing component of FIG. 3.

Now please refer to FIG. 3 and FIG. 3A. They show the schematic three-dimensional view and top view of the Z-axis magnetoresistive sensing component 1200 according to another embodiment of the present invention. Z-axis magnetoresistive sensing component 1200 primarily comprises a horizontal magnetoresistive layer 400, a magnetic-field-sensing layer 300 of the first side not parallel to the substrate (hereafter referred to as magnetic-field-sensing layer 300), a magnetic-field-sensing layer 350 of the second side not parallel to the substrate (hereafter referred to as magnetic-field-sensing layer 350), multiple conductive parts of the first side 510 and multiple conductive parts of the second side 520. The horizontal magnetoresistive layer 400 of this embodiment is the same as the one shown in FIG. 1 in their shape, material and orientation, so its descriptions are omitted to save repetitions.

The magnetic-field-sensing layer 300 of the first side in this embodiment is similar to the magnetic-field-sensing layer 300 shown in FIG. 2. It is almost perpendicular to the substrate surface, extends downwards from the first side of the horizontal magnetoresistive layer 400 and is magnetically coupled to the horizontal magnetoresistive layer 400. The magnetic-field-sensing layer 300 of the first side comprises multiple discrete sub-portions and each sub-portion takes a form of a portion of a magnetoresistive layer on the sidewall of a downward trench, so there are multiple downward trenches accommodate the multiple discrete sub-portions of the magnetic-field-sensing layer 300 respectively. Similarly, the rest of the magnetoresistive layer on the sidewall of each downward trench comprises two connecting magnetoresistive layers 310 physically connected to the magnetic-field-sensing layer 300 and an opposite magnetoresistive layer 320 physically connected to the two connecting magnetoresistive layers 310. In this embodiment, Z-axis magnetoresistive sensing component 1200 further comprises the magnetic-field-sensing layer 350 not parallel to the substrate surface. Similar to the magnetic-field-sensing layer 300, the magnetic-field-sensing layer 350 is almost perpendicular to the substrate surface, extends downwards from the second side of the horizontal magnetoresistive layer 400 and is magnetically coupled to the horizontal magnetoresistive layer 400. The magnetic-field-sensing layer 350 of the second side comprises multiple discrete sub-portions and each sub-portion takes a form of a portion of a magnetoresistive layer on the sidewall of a downward trench. Similarly, the rest of the magnetoresistive layer on the sidewall of each downward trench comprises two connecting magnetoresistive layers 360 physically connected to the magnetic-field-sensing layer 350 and an opposite magnetoresistive layer 370 physically connected to the two connecting magnetoresistive layers 360.

In comparison with FIG. 2, in FIG. 3 the distance between adjacent sub-portions of the magnetic-field-sensing layer 300 is farer and the distance between adjacent sub-portions of the magnetic-field-sensing layer 350 is also farer; the sub-portions of the magnetic-field-sensing layer 300 and the sub-portions of the magnetic-field-sensing layer 350 are disposed alternatively along the extending direction of the horizontal magnetoresistive layer 400 (Y-direction); the sub-portions of the magnetic-field-sensing layer 300 and the sub-portions of the magnetic-field-sensing layer 350 may partially overlap with each other or not overlap completely. Preferably, each downward trench of the first side and second side may have the same size, depth, sidewall slope, so each discrete sub-portion of the magnetic-field-sensing layer 300/350 has approximately the same area and thickness. Preferably, the distances between the adjacent downward trenches are the same. Preferably, the distances between the adjacent downward trenches of the first/second side are the same.

The multiple conductive parts 510 of the first side extend from the first side of the horizontal magnetoresistive layer 400 toward the second side preferably reaching the second side; the multiple conductive parts 520 of the second side extend from the second side of the horizontal magnetoresistive layer 400 toward the first side preferably reaching the first side. The conductive parts 510 of the first side and the multiple conductive parts 520 of the second side may have the same shape or different shapes (same in this embodiment) and may take any shapes (trapezoid in this embodiment). In general, the conductive parts 510 of the first side usually have the same shape, size and distance between the adjacent ones, the conductive parts 520 of the second side usually have the same shape, size and distance between the adjacent ones, and the conductive parts 510 of the first side and the conductive parts 520 of the second side are disposed alternatively along the extending direction of the horizontal magnetoresistive layer 400 (Y-direction). Preferably, the conductive parts 510 of the first side and the conductive parts 520 of the second side have the same shape and size and the adjacent sides of conductive parts 510 of the first side and conductive parts 520 of the second side are parallel (one leg of the conductive part 510 of the first side is parallel to one leg of the adjacent conductive part 520 of the second side in this embodiment). Since the conductive part 510 of the first side and the adjacent conductive part 520 of the second side adopts one or more conductive metals as their materials, their resistivity is far smaller than the resistivity of the magnetoresistive material adopted by the horizontal magnetoresistive layer 400. Hence, in the area where the conductive part 510/520 is in physical contact with the horizontal magnetoresistive layer 400 electrical current would take the conductive part 510/520 with smaller resistivity as its conducting path; within the horizontal magnetoresistive layer 400 (that is the area between adjacent conductive part 510 and conductive part 520) electrical current I/I' would take the shortest distance between the adjacent conductive part 510 and conductive part 520 as its conducting path. When within the horizontal magnetoresistive layer 400 electrical current flows from the conductive part 520 to the conductive part 510, current I forms an angle +ω with respect to the extending direction of the horizontal magnetoresistive layer 400 (Y-direction). When within the horizontal magnetoresistive layer 400 electrical current flows from the conductive part 510 to the conductive part 520, current I' forms an angle −ω with respect to the extending direction of the horizontal magnetoresistive layer 400 (Y-direction). ω represents the same number and its magnitude depends on a slope of the leg of the trapezoid. +ω represents an angle deviating from a base line along clockwise direction and −ω represents an angle deviating from a base line along counterclockwise direction. The horizontal magnetoresistive layer 400 and the conductive part 510/520 together form a conducting path: the horizontal magnetoresistive layer 400→the conductive part 510→the horizontal magnetoresistive layer 400 between adjacent conductive part 510 and conductive part 520→the conductive part 520→the horizontal magnetoresistive layer 400 between adjacent conductive part 520 and conductive part 510 . . . .

Now refer to FIG. 3A. All the sub-portions of the magnetic-field-sensing layer 300 and multiple conductive parts 510 extend from the first side of the horizontal magnetoresistive layer 400. Except rare situations where the length of the horizontal magnetoresistive layer 400 would not allow, each sub-portion of the magnetic-field-sensing layer 300 corresponds to a conductive part 510 of the first side and they partially overlap at the first side. The length of overlap is preferable half length of a sub-portion of the magnetic-field-sensing layer 300 and/or half length of a base side of the conductive part 510 (half length of a base side of a trapezoid in this embodiment). Same principle can be applied to the sub-portions of the magnetic-field-sensing layer 350 and multiple conductive parts 520 extending from the second side of the horizontal magnetoresistive layer 400 (their corresponding relationship and overlap at the second side).

Figure 5:
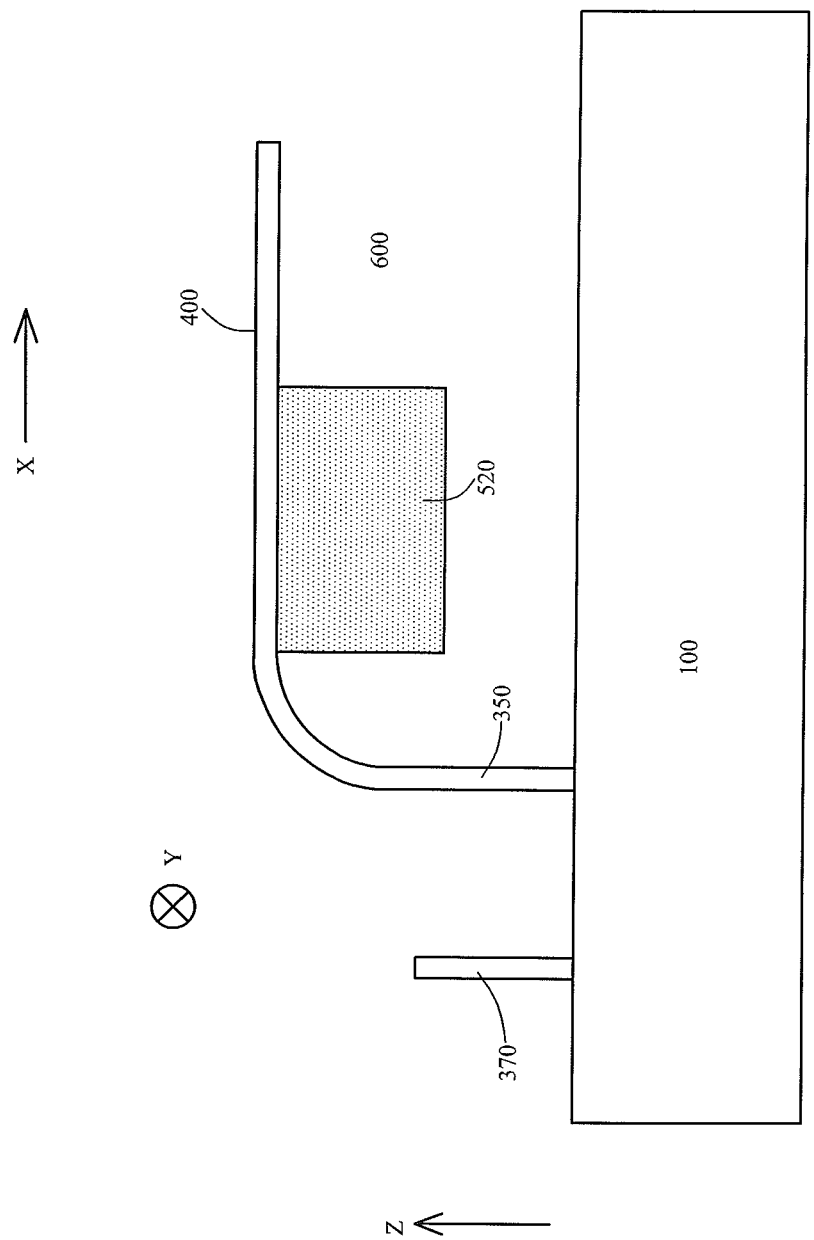
FIG. 5 shows the schematic cross section view taken along line C-C' of FIG. 3.

Since the cross section view taken along line D-D' of FIG. 3 is the same one shown in FIG. 4 and FIG. 4 is fully explained in the previous paragraph, repetitions will be omitted here. The cross section view taken along line C-C' of FIG. 3 is shown in FIG. 5. Compared with FIG. 4, in FIG. 5 the downward trench is at the second side of the horizontal magnetoresistive layer 400, so the magnetic-field-sensing layer 350 and opposite magnetoresistive layer 370 are at the second of the horizontal magnetoresistive layer 400. All the modified embodiments addressed with respect to FIG. 4 can be equally applied to FIG. 5, their example or descriptions are omitted here to save repetitions.

Figure 6:
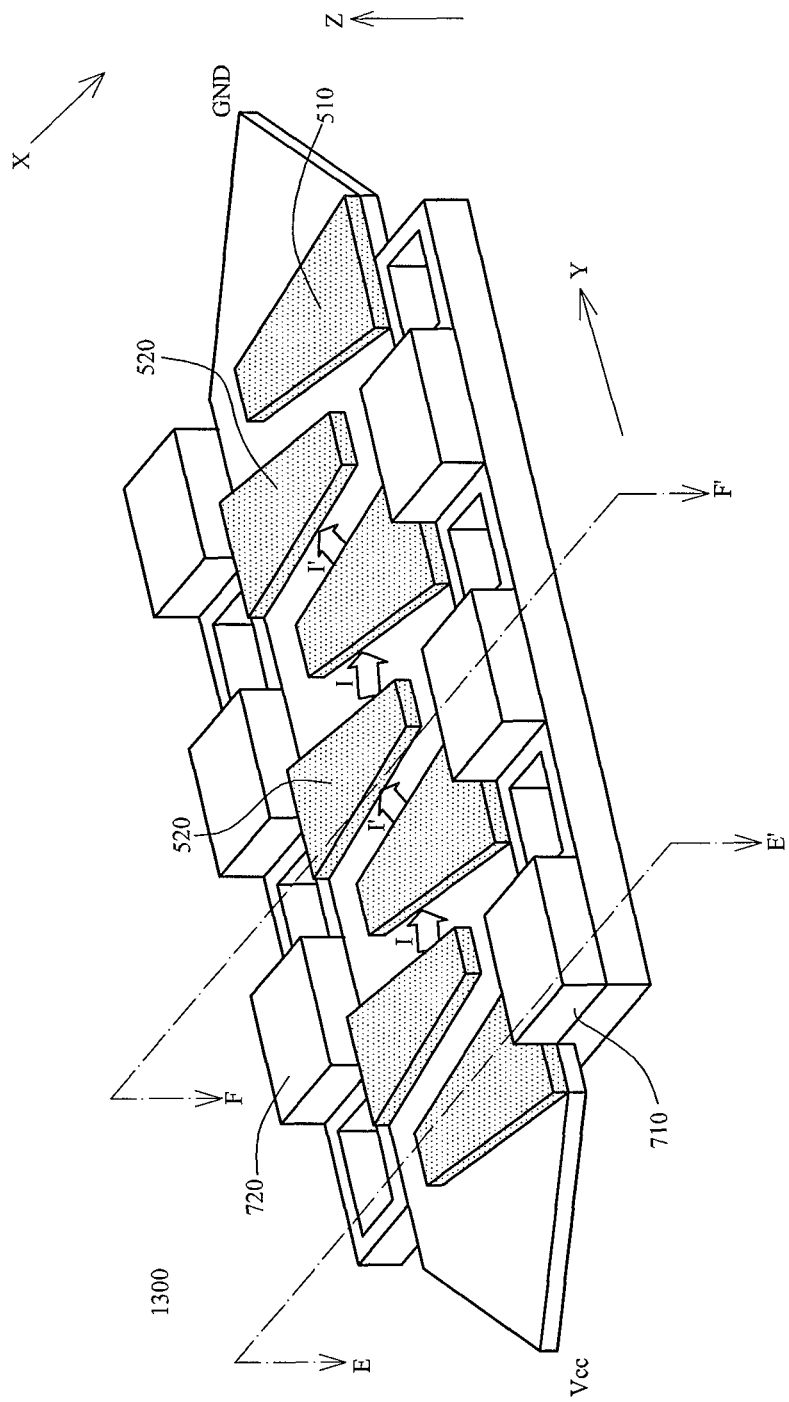
FIG. 6 shows the schematic three-dimensional view of the Z-axis magnetoresistive sensing component according to still another embodiment of the present invention.
Figure 7A:
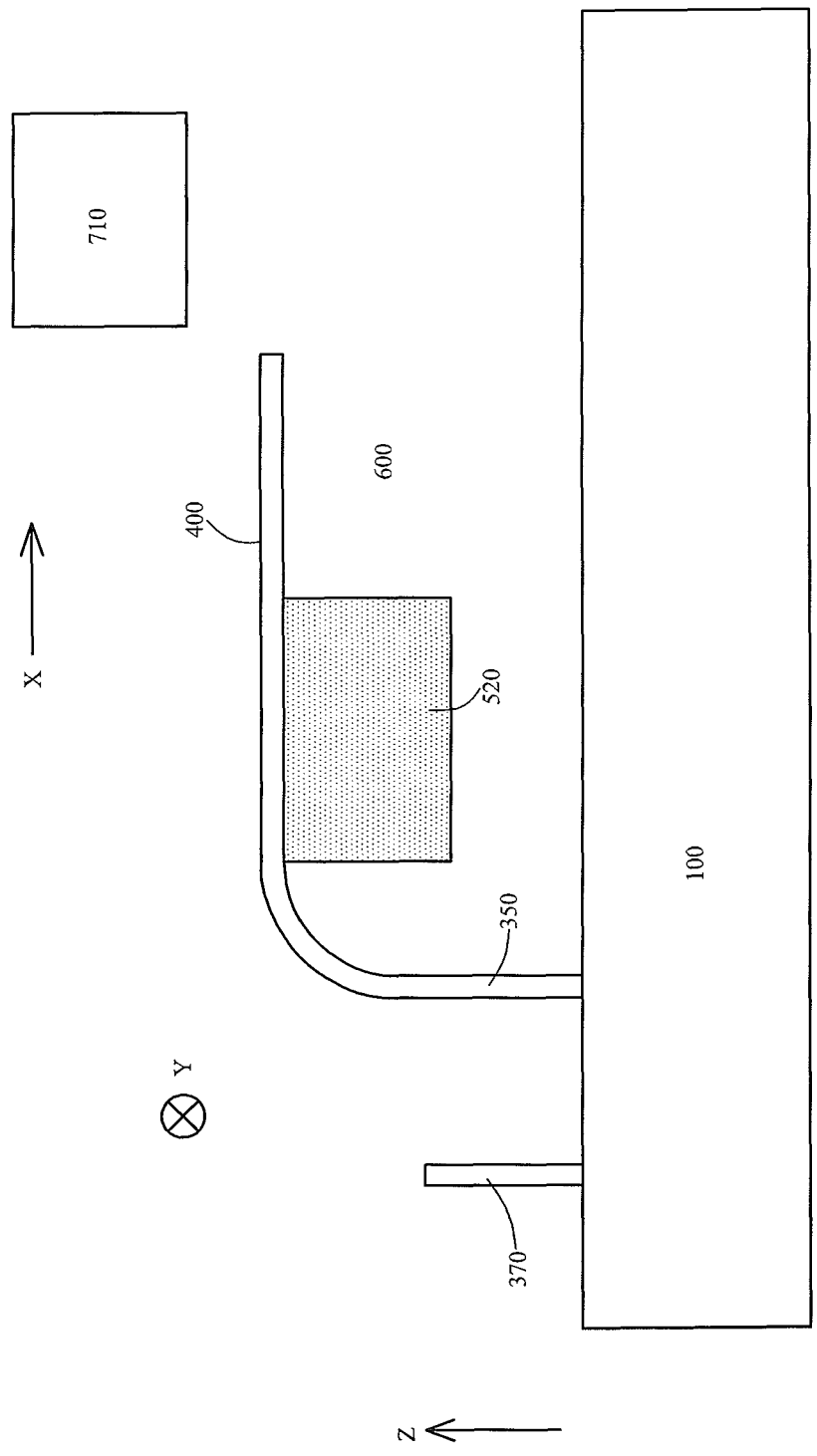
FIG. 7A shows the schematic cross section view taken along line E-E' of FIG. 6.
Figure 7B:
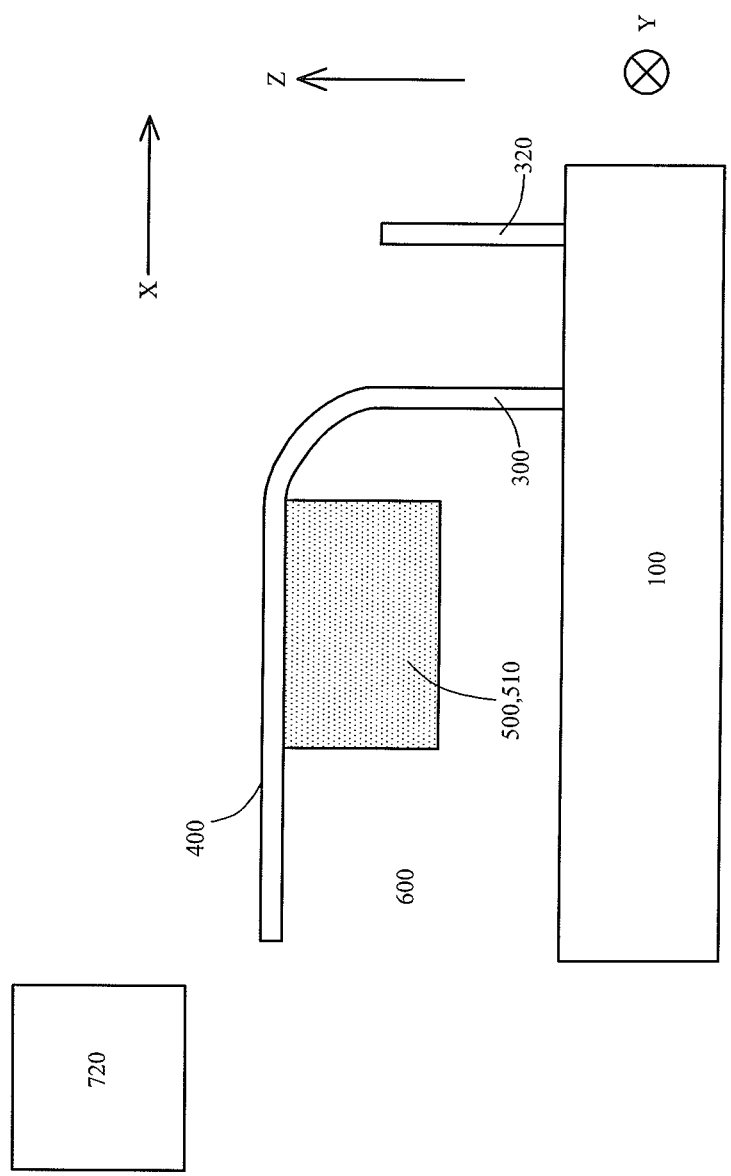
FIG. 7B shows the schematic cross section view taken along line F-F' of FIG. 6.
Figure 8A:
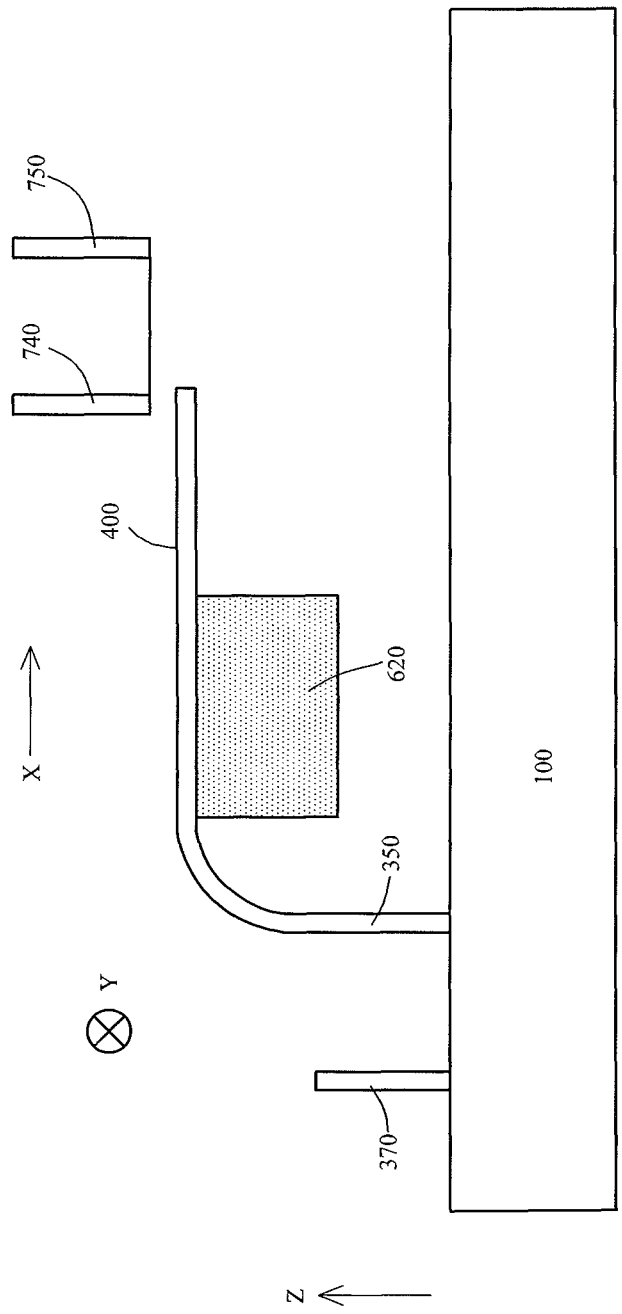
FIG. 8A shows another embodiment of the cross section shown in FIG. 7A.
Figure 8B:
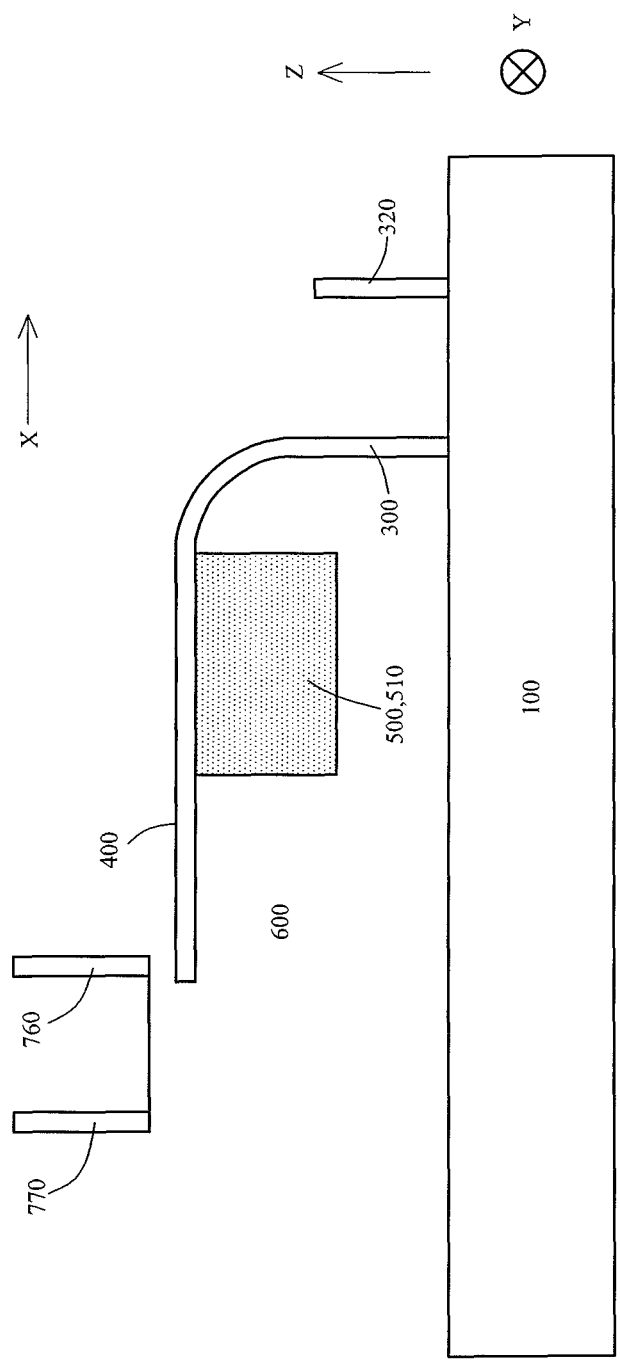
FIG. 8B shows another embodiment of the cross section shown in FIG. 7B.

Now refer to FIG. 6, FIG. 7A and FIG. 7B. They show the schematic three-dimensional view, cross section view taken along line E-E' of FIG. 6 and cross section view taken along line F-F' of FIG. 6 of the Z-axis magnetoresistive sensing component 1300 according to still another embodiment of the present invention. Z-axis magnetoresistive sensing component 1300 share the same operational principle with the Z-axis magnetoresistive sensing component 1200 of FIG. 3. The shapes, materials, orientations, relative positions of the horizontal magnetoresistive layer 400, conductive part 510, conductive part 520, magnetic-field-sensing layer 300 and magnetic-field-sensing layer 350 and conducting path and direction of the electrical current are the same for Z-axis magnetoresistive sensing component 1200 and 1300, so here only the differences are addressed. In this embodiment, Z-axis magnetoresistive sensing component 1300 comprises all the elements of Z-axis magnetoresistive sensing component 1200 and further comprises multiple first magnetic flux concentrating structures 710 and multiple second magnetic flux concentrating structures 720. Multiple first magnetic flux concentrating structures 710 extend upwards from the first side of the horizontal magnetoresistive layer 400 and magnetically coupled thereto. Multiple first magnetic flux concentrating structures 710 and the sub-portions of the magnetic-field-sensing layer 300 are disposed alternatively along the first side of the horizontal magnetoresistive layer. Multiple second magnetic flux concentrating structures 720 extend upwards from the second side of the horizontal magnetoresistive layer 400 and magnetically coupled thereto. Multiple second magnetic flux concentrating structures 720 and the sub-portions of the magnetic-field-sensing layer 350 are disposed alternatively along the second side of the horizontal magnetoresistive layer. From FIGS. 6, 7A and 7B we can see the first magnetic flux concentrating structures 710 and second magnetic flux concentrating structures 720 take a form of a cubic of the same size and they preferably be disposed above the first or second sides of the horizontal magnetoresistive layer 400 (not right above the horizontal magnetoresistive layer 400). In this way, they can effectively concentrate/guide the magnetic flux passing through the horizontal magnetoresistive layer 400. However, they can adopt other forms or different shape of bulk structure according to design and/or process requirements as long as they use magnetic materials or magnetoresistive materials. For example, as shown in FIG. 8A and FIG. 8B, use one/more upward trenches above the first side and portions 740/750 of magnetoresistive layers on the sidewalls of the upward trenches to replace the first magnetic flux concentrating structures 710 and use one/more upward trenches above the second side and portions 760/770 of magnetoresistive layers on the sidewalls of the upward trenches to replace second magnetic flux concentrating structures 720. It is noted that portions of the magnetoresistive material on the sidewall parallel to the paper surface are not shown. 740 is the magnetic-field-guiding layer of the first side and 760 is the magnetic-field-guiding layer of the second side. Both of 740 and 760 are not parallel to the substrate surface and have functions of guiding magnetic flux and sensing magnetic field. Therefore, when 740/750 of magnetic/magnetoresistive material and 760/770 of magnetic/magnetoresistive material are used to sense magnetic field, they are referred to as the third magnetic-field-sensing layer to be distinguished from the magnetic-field-sensing layer 300 of the first side and the magnetic-field-sensing layer 350 of the second side. Other elements shown in FIGS. 7A, 7B, 8A and 8B have already been explained in relation to FIG. 4 and FIG. 5, they are not described again.

Furthermore, the magnetic flux concentrating structures shown in FIGS. 7A, 7B, 8A and 8B (that is one of 710, 720, 740+750 and 760+770 or any combination thereof) can be equally applied to the first side or second side or both sides of all the Z-axis magnetoresistive sensing components 1000□1000', 1200, 1300, 1400, 1500, 1600. For example for Z-axis magnetoresistive sensing component 1000, a second magnetic flux concentrating structure 720 of long strip shape shown in FIG. 7B can be disposed above the second side of the horizontal magnetoresistive layer 400 or a long trench and the magnetoresistive layer on the sidewall of the trench shown in FIG. 8B can be disposed above the second side of the horizontal magnetoresistive layer 400. For example for Z-axis magnetoresistive sensing component 1100, second magnetic flux concentrating structures 720 of cubic shape shown in FIG. 7B can be disposed above the second side of the horizontal magnetoresistive layer 400 or a long trench and the magnetoresistive layer on the sidewall of the trench shown in FIG. 8B can be disposed above the second side of the horizontal magnetoresistive layer 400.

Figure 9C:
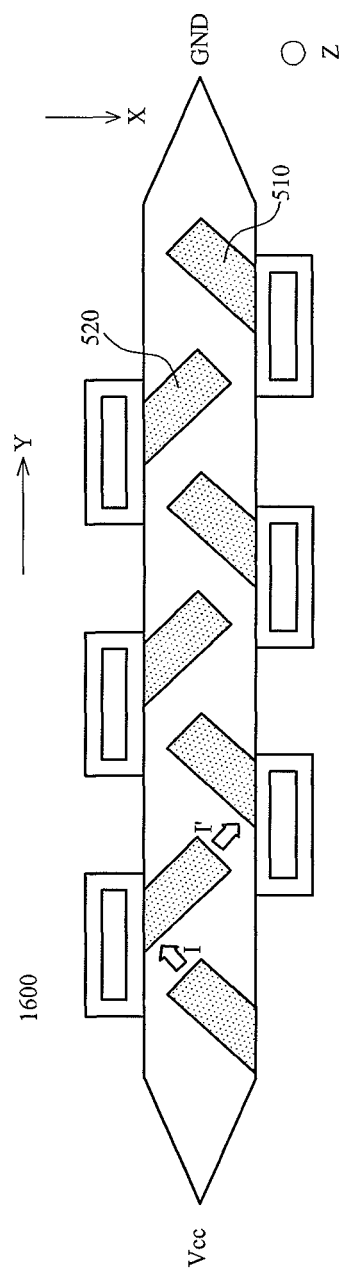

Now refer to FIGS. 9A-9C, they show the top views of the Z-axis magnetoresistive sensing components according to other embodiments of the present invention. After detailed explanations for Z-axis magnetoresistive sensing component 1200 of FIG. 3 are provided, a person of ordinary skills in the art should understand that the explanations for FIG. 3 can be foundations to embodiments of FIG. 9A-9C, so repetitions are omitted here. The difference between Z-axis magnetoresistive sensing component 1400 of FIGS. 9A and Z-axis magnetoresistive sensing component 1200 is: the conductive part 510 of the first side and the conductive part 520 of the second side of FIG. 3 are trapezoid-shaped and they all extend from one side of the horizontal magnetoresistive layer 400 toward the other side of the horizontal magnetoresistive layer 400 without reaching the other side while the conductive part 510 of the first side and the conductive part 520 of the second side of FIG. 9A take isosceles triangle or equilateral triangle as their shape (depends on width of the horizontal magnetoresistive layer 400) and they all extend from one side of the horizontal magnetoresistive layer 400 toward the other side of the horizontal magnetoresistive layer 400 reaching the other side. Since the arrangement of the horizontal magnetoresistive layer 400, the magnetic-field-sensing layer 300 of the first side and the magnetic-field-sensing layer 350 of the second side are the same as the one of FIG. 3, they are not repeated again.

There are several differences between the Z-axis magnetoresistive sensing component 1500 of FIGS. 9B and Z-axis magnetoresistive sensing component 1200. First, the multiple downward trenches of the first side and the multiple downward trenches of the second side of FIG. 3 are spread out more than the ones of FIG. 9B, thereby distance between the adjacent sub-portions of the magnetic-field-sensing layer 300 and distance between the adjacent sub-portions of the magnetic-field-sensing layer 350 of FIG. 3 are farer than the ones of FIG. 9B. So the magnetic-field-sensing layer 300 and magnetic-field-sensing layer 350 of FIG. 9B are disposed alternatively along the extending direction of the horizontal magnetoresistive layer 400 but they overlap more than the ones of FIG. 3. Second, the conductive part 510 of the first side and the conductive part 520 of the second side of FIG. 3 are trapezoid-shaped, they all extend from one side of the horizontal magnetoresistive layer 400 toward the other side of the horizontal magnetoresistive layer 400 passing the half width of the horizontal magnetoresistive layer 400 and they are disposed alternatively along the extending direction of the horizontal magnetoresistive layer 400. the conductive part 510 of the first side and the conductive part 520 of the second side of FIG. 9B are parallelogram-shaped, they all extend from one side of the horizontal magnetoresistive layer 400 toward the other side of the horizontal magnetoresistive layer 400 without passing the half width of the horizontal magnetoresistive layer 400 and they are disposed symmetrically along the extending direction of the horizontal magnetoresistive layer 400.

Since the differences addressed in the previous paragraph, when Z-axis magnetoresistive sensing component 1500 operates, the electrical current does not flow from the conductive part 510 of the first side to the conductive part 520 of the second side or from the conductive part 520 of the second side to the conductive part 510 of the first side. Because the conductive part 510 of the first side and the conductive part 520 of the second side have farer distance between them and the high resistivity of the magnetoresistive material between them, the conducting path become the following route: in an area where the conductive part 510 is in physically contact with the horizontal magnetoresistive layer 400 electrical current would take the conductive part 510 with smaller resistivity as its conducting path while within the horizontal magnetoresistive layer 400 (that is, between the adjacent conductive parts 510) electrical current I' would take the shortest distance between the adjacent conductive parts 510 as its conducting path. The horizontal magnetoresistive layer 400 and the conductive parts 510 together form at least one electrical path (horizontal magnetoresistive layer 400→conductive part 510→horizontal magnetoresistive layer 400 between the adjacent conductive parts 510→the next conductive part 510 . . . ). Similarly, within the horizontal magnetoresistive layer 400 (that is, between the adjacent conductive parts 520) electrical current I would take the shortest distance between the adjacent conductive parts 520 as its conducting path. The horizontal magnetoresistive layer 400 and the conductive parts 520 together form at least one electrical path (horizontal magnetoresistive layer 400→conductive part 520→horizontal magnetoresistive layer 400 between the adjacent conductive parts 520→the next conductive part 520 . . . ). When the conductive part 510 and the conductive part 520 have the same shape, size and distance between the adjacent ones, an angle between a first conducting direction of current I' and the extending direction of the horizontal magnetoresistive layer 400 is equivalent to an angle between a second conducting direction of current I and the extending direction of the horizontal magnetoresistive layer 400. The value of the angle depends on the slope of the parallel sides of the Parallelogram.

There are several differences between the Z-axis magnetoresistive sensing component 1600 of FIGS. 9C and Z-axis magnetoresistive sensing component 1200. The conductive part 510 of the first side and the conductive part 520 of the second side of FIG. 3 are trapezoid-shaped, electrical current of FIG. 3 flows from a leg of the conductive part of one side to a leg of the adjacent conductive part of the other side, and each conductive part 510/520 partially overlap with the corresponding magnetic-field-sensing layer 300/350. In FIG. 9C, the conductive part 510 of the first side and the conductive part 520 of the second side have a long strip shape not parallel to the horizontal magnetoresistive layer 400, electrical current flows from the pointing end of a conductive part of one side to the base end of the next conductive part of the other side, and each conductive part 510/520 completely overlap with the corresponding magnetic-field-sensing layer 300/350. When the conductive part 510 and the conductive part 520 have the same shape, size, distance between the adjacent ones and value of tilted angle with respect to the extending direction of the horizontal magnetoresistive layer 400, an angle between a first conducting direction of current I' and the extending direction of the horizontal magnetoresistive layer 400 is equivalent to an angle between a second conducting direction of current I and the extending direction of the horizontal magnetoresistive layer 400. The value of the angle depends on the value of tilted angle with respect to the extending direction of the horizontal magnetoresistive layer 400.

In the previous embodiments, since in Z-axis magnetoresistive sensing components 1000 and 1100 the electrical currents i flowing between the adjacent conductive parts 500 follow an unique direction, the outputs of Z-axis magnetoresistive sensing components 1000 and 1100 not only respond to an Z-axis magnetic field but also respond to an X-axis magnetic field. Therefore, a measure of designing a combination of Z-axis magnetoresistive sensing components 1000/1100 of different orientations or a measure of adding extra circuitry must be taken for the Z-axis magnetoresistive sensing device in order to render the Z-axis magnetoresistive sensing device responsive to a Z-axis magnetic field but immune to a X-axis magnetic field.

In the Z-axis magnetoresistive sensing component 1200, 1300, 1400, 1500, 1600, electrical current between the adjacent conductive parts (that is conductive part of the first side and the adjacent conductive part of the second except for 1500; for 1500, conductive part of the first side and the adjacent conductive part of the first side or conductive part of the second side and the adjacent conductive part of the second side) have two conducting directions (I and I') and said two directions are symmetrical to the extending direction of the horizontal magnetoresistive layer 400. Therefore, when an external magnetic field of X-direction is applied upon these Z-axis magnetoresistive sensing components (that is, magnetic flux points from one side of the horizontal magnetoresistive layer 400 to the other side), the effects caused by two conducting directions would counteract, thereby resulting in almost no change on the output of these Z-axis magnetoresistive sensing components. When an external magnetic field of Z-direction is applied upon these Z-axis magnetoresistive sensing components (that is two kinds of magnetic fluxes, one kind of magnetic flux points from first side of the horizontal magnetoresistive layer 400 to the second side and the other kind of magnetic flux points from the second side to the first side), the two conducting directions interact with the two kinds of magnetic fluxes, thereby resulting in a change on the output of these Z-axis magnetoresistive sensing components. Therefore Z-axis magnetoresistive sensing component 1200, 1300, 1400, 1500, 1600 can be used alone to achieve the result of sensing Z-axis magnetic field.

Now refer to FIGS. 10A-10B, they show the Z-axis magnetoresistive sensing devices according to embodiments of the present invention, wherein the Z-axis magnetoresistive sensing devices comprise a Wheatstone bridge structure comprising the Z-axis magnetoresistive sensing components according to embodiments of the present invention.

The Z-axis magnetoresistive sensing device of FIG. 10A comprises a Wheatstone bridge structure. This Wheatstone bridge structure has 4 resistive arms (upper right arm, lower right arm, upper left arm and lower left arm) and each resistive arm at least comprises a Z-axis magnetoresistive sensing component 1400. Although in this fig. each resistive arm only comprises a Z-axis magnetoresistive sensing component 1400, each resistive arm may comprise multiple Z-axis magnetoresistive sensing components 1400 connected by interconnect in serial electrical connection. Furthermore, Z-axis magnetoresistive sensing component 1400 in each resistive arm may be replaced by any one of Z-axis magnetoresistive sensing component 1200, 1300, 1500, 1600 or their modified embodiment while keeping the operation of the whole Wheatstone bridge structure. The upper end of the upper right resistive arm is electrically coupled to working voltage Vcc by interconnect; the lower end of the upper right resistive arm is electrically coupled to the upper end of the lower right resistive arm by interconnect and the voltage between these two arms is defined as second voltage V2. The lower end of the lower right resistive arm is electrically coupled to ground by interconnect. The upper end of the upper left resistive arm is electrically coupled to working voltage Vcc by interconnect; the lower end of the upper left resistive arm is electrically coupled to the upper end of the lower left resistive arm by interconnect and the voltage between these two arms is defined as first voltage V1. The lower end of the lower left resistive arm is electrically coupled to ground by interconnect. One may optionally adjust the magnetization direction of the horizontal magnetoresistive layer 400 within the 4 resistive arms into a predetermined direction (represented by direction of M, that is Y-direction in this embodiment) by a set/reset circuitry before using the Wheatstone bridge structure. When the magnetic-field-sensing layers 300/350 feel a Z-axis magnetic field, a change of the resistance may occur to resistive arms of the bridge structure in response to a change of the external magnetic field. This may cause a change of the voltage difference between first voltage V1 and second voltage V2.

The Z-axis magnetoresistive sensing device of FIG. 10B also comprises a Wheatstone bridge structure. The Z-axis magnetoresistive sensing device of FIG. 10A uses 4 identical Z-axis magnetoresistive sensing components, while The Z-axis magnetoresistive sensing device of FIG. 10B uses a pair of Z-axis magnetoresistive sensing components 1000 and a pair of Z-axis magnetoresistive sensing components 1000' to counteract an influence caused by X-axis magnetic field. The difference between the Z-axis magnetoresistive sensing component 1000 and 1000' is that the magnetic-field-sensing layer 300 of component 1000 is at the first side of the horizontal magnetoresistive layer 400 while the magnetic-field-sensing layer 300 of component 1000' is at the second side of the horizontal magnetoresistive layer 400. However, to keep the operation of the bridge structure, in FIG. 10B the orientations of the magnetic-field-sensing layer 300 can be properly adjusted (at the first side or second side) or the orientations of the conductive parts can be properly adjusted (left up right down or left down right up). Since the bridge structure of FIG. 10B is similar to the bridge structure of FIG. 10A in their basic structure, arm connections and operations, the descriptions thereof is omitted here to save repetitions.

The following table 1 and table 2 in their content show the status of the upper left arm, the lower left arm, the upper right arm and the lower right arm of the bridge structures when applying an external magnetic field of +X-direction and +Z-direction respectively to the bridge structures of 10A and 10B. The +X-direction is defined as a direction pointing from the second side of the horizontal magnetoresistive layer 400 to its first side and the −X-direction is defined as a direction pointing from the first side of the horizontal magnetoresistive layer 400 to its second side. Similarly, the +Z-direction is defined as a direction pointing from the substrate surface to the horizontal magnetoresistive layer 400 and the −Z-direction is defined as a direction pointing from the horizontal magnetoresistive layer 400 to the substrate surface.

TABLE 1

The responses and outputs of all the resistive arms of the bridge structures in FIG. 10A and 10B when applying an external magnetic field of the +X-direction

|  | Upper left arm | Lower left arm | Upper right arm | Lower right arm |
|---|---|---|---|---|
| Bridge structure of 10A | | | | |
| Magnetic field felt | +X-direction | +X-direction | +X-direction | +X-direction |
| Change of resistance | ~0 | ~0 | ~0 | ~0 |
| Output voltage | | ΔV = V1 − V2 = ~0 | | |
| Bridge structure of 10B | | | | |
| Magnetic field felt | +X-direction | +X-direction | +X-direction | +X-direction |
| Change of resistance | increased | increased | increased | increased |
| Output voltage | | ΔV = V1 − V2 = ~0 | | |

TABLE 2

The responses and outputs of all the resistive arms of the bridge structures in FIG. 10A and 10B when applying an external magnetic field of the direction of +Z

|  | Upper left arm | Lower left arm | Upper right arm | Lower right arm |
|---|---|---|---|---|
| Bridge structure of 10A | | | | |
| Magnetic field felt | +X-direction and −X-direction | +X-direction and −X-direction | +X-direction and −X-direction | +X-direction and −X-direction |
| Change of resistance | decreased | increased | increased | decreased |
| Output voltage | | ΔV = V1 − V2≠0 | | |
| Bridge structure of 10B | | | | |
| Magnetic field felt | −X-direction | +X-direction | +X-direction | −X-direction |
| Change of resistance | decreased | increased | increased | decreased |
| Output voltage | | ΔV = V1 − V2≠0 | | |

Although the exact output voltages are not shown in table 1 and table 2, it is noted that the output voltage of the bridge structure 10A is larger than the output voltage of the bridge structure 10B when same amount of external magnetic field of +Z-direction is applied to both structures 10A and 10B. That is, the bridge structure of 10A is more sensitive than the bridge structure of 10B.

FIGS. 10A and 10B show the magnetoresistive sensing devices according to embodiments of the present invention. However, the so-called magnetoresistive sensing device is a device capable of sensing a change of magnetic field of a specific direction and not necessarily taking a form of Wheatstone bridge structure. Furthermore, the present invention comprises a magnetic-field-sensing layer not parallel to the surface of the substrate and this magnetic-field-sensing layer is not limited to a shape of thin plate as long as it is capable of sensing Z-axis magnetic field that is perpendicular to the surface of the substrate. It may be a vertical portion of any three dimensional structure such as a portion of a magnetoresistive layer on the sidewall of a cylindrical or a rectangular trench. If it is integrated with a magnetoresistive sensing component capable of sensing X-axis/Y-axis magnetic field that is parallel to the surface of the substrate, package complexity and size of the final sensing product can be significantly reduced.

Figure 11:
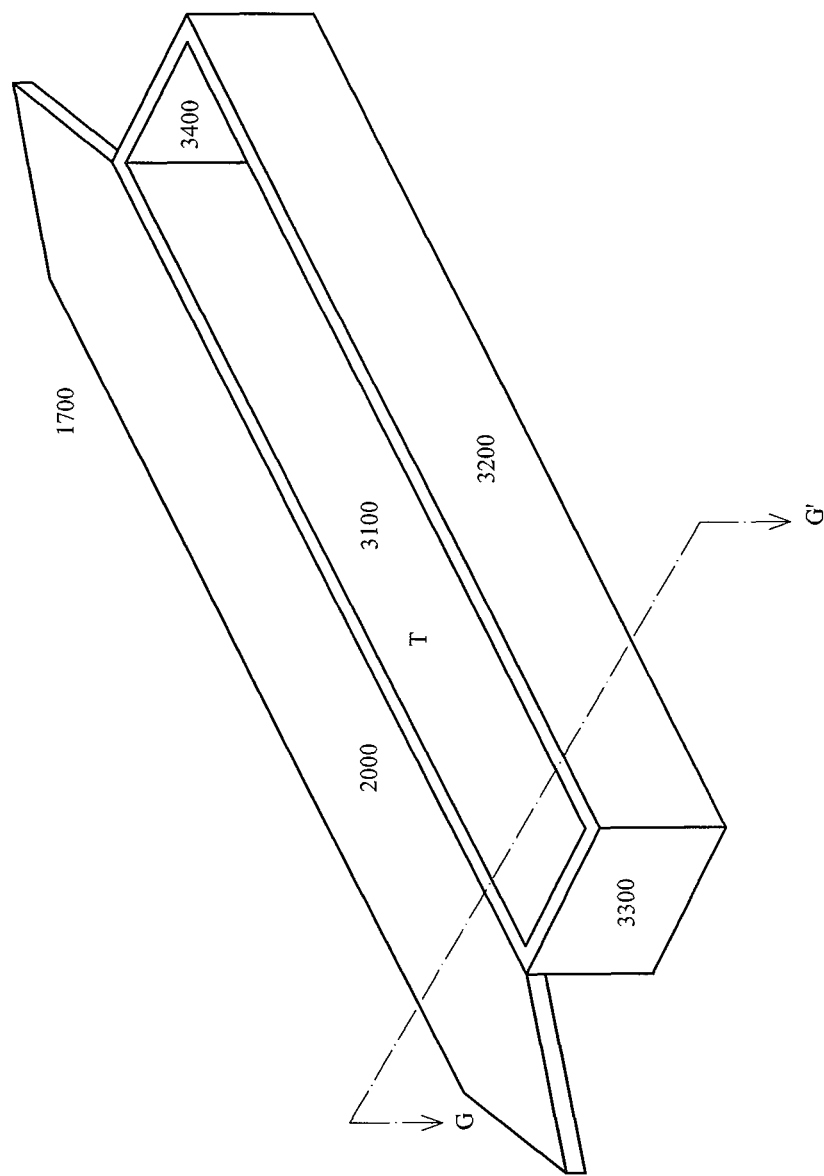
FIG. 11 shows a magnetoresistive sensing component according to one embodiment of the present invention, wherein this component comprises at least one trench.

FIG. 11 shows a magnetoresistive sensing component 1700 according to one embodiment of the present invention, wherein component 1700 comprises at least one trench. Component 1700 could be used in all xMR devices. The term "xMR devices" shall include all known magnetoresistive devices using at least one magnetoresistive material, such as AMR (anisotropic magnetoresistive) devices, GMR (giant magnetoresistive) devices, CMR (colossal magnetoresistive) devices, TMR (tunnel magnetoresistive) devices, or EMR (extraordinary magnetoresistive) devices. The term "magnetoresistive material/layer" here means a material/layer whose resistance would change according to a change of an external magnetic field. The at least one magnetoresistive material comprises but is not limited to a ferromagnet material, an antiferromagnet material, a nonferromagnet material and a tunneling oxide or any combination thereof. Specifically, the at least one magnetoresistive material comprises but is not limited to permolloy, iron/chromium alloy (Fe/Cr), cobalt/iron alloy (Co/Fe), cobalt/copper alloy (Co/Cu), cobalt/iron/copper alloy (Co/Fe/Cu), nickel/iron alloy (Ni/Fe), Iron/manganese alloy (Fe/Mn), nickel/manganese alloy (Ni/Mn), an alloy of at least two metal elements or any combination thereof.

The magnetoresistive sensing component 1700 primarily comprises a horizontal magnetoresistive layer 2000, a downward trench T, a nonparallel magnetoresistive layer 3100, an optional opposite layer 3200 and optional connecting layers 3300 and 3400. The horizontal magnetoresistive layer 2000 is disposed above the surface of the substrate 100 and substantially parallel thereto (see FIGS. 12A-12D). The term "substantially" here represents deviations caused by process tolerances such as thickness ranges of under layers, etching non-uniformity, CMP (chemical mechanical polishing) dishing effect or micro-loading effect. The substrate 100 may be a silicon substrate, a silicon-on-insulator substrate, a glass substrate, a composite substrate or a silicon substrate with active devices and interconnects thereon. The horizontal magnetoresistive layer 2000 has a shape of long strip in FIG. 11, but it could take any shapes based on design and performance requirements of a magnetoresistive device. The nonparallel magnetoresistive layer 3100 can be designed to be a slant as shown in FIG. 11 or a combination of multiple slants (that is, the nonparallel magnetoresistive layer 3100 has multiple discrete sub-portions) as the magnetic-field-sensing layer 300 shown in FIG. 2. When the nonparallel magnetoresistive layer 3100 has multiple discrete sub-portions, the downward trench T would become multiple discrete trenches as shown in FIG. 2 and each discrete trench corresponds to a discrete sub-portion of the nonparallel magnetoresistive layer 3100. Even though FIG. 11 takes vertical nonparallel magnetoresistive layer 3100 as example, the present invention is not limited thereto. The nonparallel magnetoresistive layer 3100 extends downwards from a first side of the horizontal magnetoresistive layer 2000 and physically connected thereto, so as to redirect/guide a magnetic field or a magnetic flux substantially perpendicular to the substrate 100 and/or the horizontal magnetoresistive layer 2000. The horizontal magnetoresistive layer 2000 and the nonparallel magnetoresistive layer 3100 may be formed from the same magnetoresistive material/materials in one structure, or may be formed from the same or different magnetoresistive materials separately into physically connected separate structures. Even when the horizontal magnetoresistive layer 2000 and the nonparallel magnetoresistive layer 3100 use the same material/materials and are formed in one structure, different thicknesses can be adopted according to design requirements or different thicknesses may be obtained due to process capabilities or process flow. The nonparallel magnetoresistive layer is disposed on the inner sidewall of the downward trench T and this makes it a long thin strip. The rest of the magnetoresistive material/materials on the inner sidewall of the downward trench T comprise two optional connecting layers 3300 and 3400 physically connected to nonparallel magnetoresistive layer 3100 and an optional opposite layer 3200 physically connected to the two optional connecting layers 3300 and 3400. In a preferred embodiment, the two optional connecting layers 3300 and 3400 and the optional opposite layer 3200 are formed together with the nonparallel magnetoresistive layer 3100 from the same material/materials and they will not be discussed in great detail.

Although not shown in FIG. 11, the magnetoresistive device 1700 may be modified to have another nonparallel magnetoresistive layer extending from a second side of the horizontal magnetoresistive layer 2000. This another nonparallel magnetoresistive layer is similar to the nonparallel magnetoresistive layer 3100 on its material/materials, construction, shape, relation to downward trench T and function, so descriptions regarding the nonparallel magnetoresistive layer 3100 mentioned earlier and later can be equally applied to this another nonparallel magnetoresistive layer.

Figure 12A:
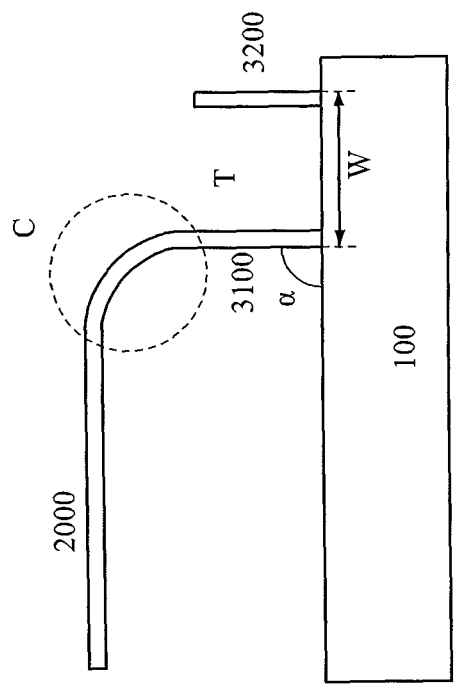
FIG. 12A shows a cross section view taken along line G-G' of FIG. 11 according to one embodiment of the present invention.
Figure 12B:
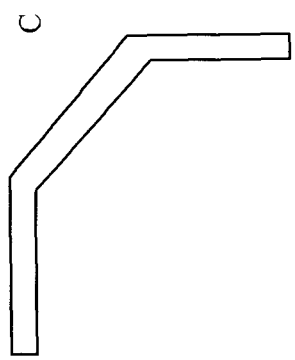
FIG. 12B shows the enlarged view of corner portion C of FIG. 12A.
Figure 12B:
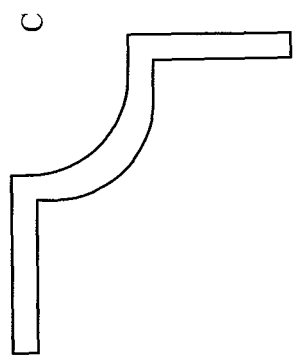
Figure 12C:
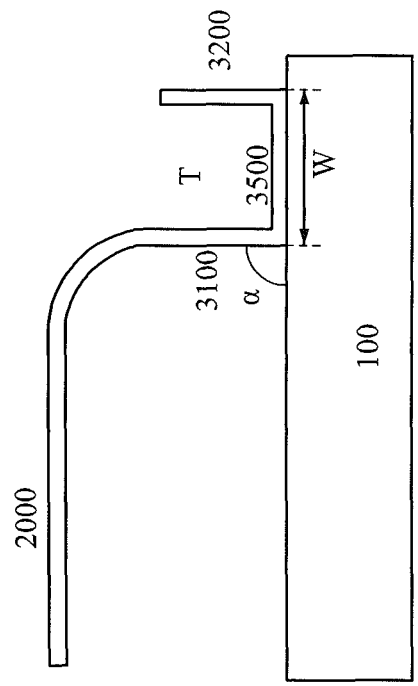
FIG. 12C shows another cross section view taken along line G-G' of FIG. 11 according to another embodiment of the present invention.
Figure 12D:
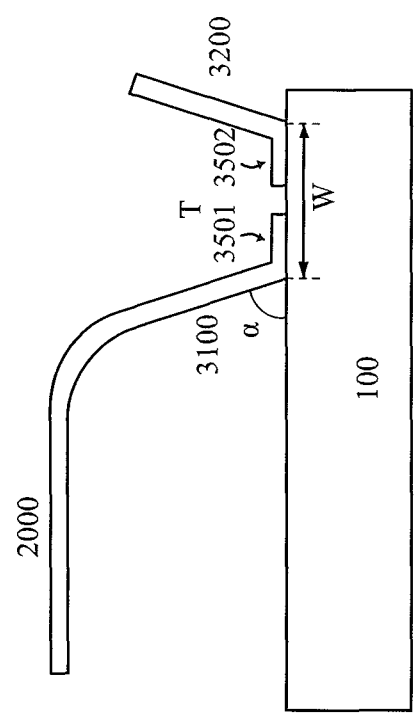
FIG. 12D shows still another cross section view taken along line G-G' of FIG. 11 according to still another embodiment of the present invention.

Please refer to FIGS. 12A, 12B, 12C and 12D now. FIGS. 12A, 12C and 12D show cross sectional views taken along line G-G' of FIG. 11 according to different embodiments of the present invention. FIG. 12B shows the enlarged view of corner portion C of FIG. 12A. In 12A, the nonparallel magnetoresistive layer 3100 is disposed on a sidewall of the downward trench T and physically connected to the horizontal magnetoresistive layer 2000. The horizontal magnetoresistive layer 2000 is separated from the substrate by one or more dielectric materials (not shown) which comprise silicon nitride, silicon oxide, oxygen-rich silicon oxide, oxide made from tetraethoxy silane (TEOS), undoped silicate glass, phosphorus doped silicate glass, borophosphosilicate glass, silicon oxynitride, silicon carbide, silicon carbon nitride, spin-on glass, low-k dielectric materials such as Black Diamond™ and SiLK™, or any combination thereof. The nonparallel magnetoresistive layer 3100 is also separated from the optional opposite layer 3200 by one or more dielectric materials (not shown) mentioned above. It is worth mentioning that in this embodiment the nonparallel magnetoresistive layer 3100 is composed of a straight part and a curved part on the corner portion C of trench T. The curved part of the nonparallel magnetoresistive layer 3100 is well rounded as shown in FIG. 12A to optimize magnetic hysteresis loop of a magnetoresistive device comprising thereof hence performance of such a device. Generally, tuning curvature of the corner portion C of the trench T would also change the magnetic hysteresis loop. The more linear the magnetic hysteresis loop is, the better performance is obtained. However, various shapes of the corner portion C would also obtain similar performance For example, the corner portion C of the trench T may look like the enlarged corner portion C shown in FIG. 12B which has at least one facet. The facet can be formed by dry or wet etching or their combination, sputtering, surface treatment, tuning etching condition, tuning lithography condition or photoresist coverage range or their combination, or other processes performed on the trench corner portion (which could be dielectric material formed by inter-metal dielectric (ILD) layer) before forming one or more magnetoresistive materials. Furthermore, dry or wet etching or their combination, sputtering, surface treatment, tuning etching condition, tuning lithography condition or photoresist coverage range or their combination, or other processes may be also performed on the one or more magnetoresistive materials formed on the facet to further smoothen the one or more magnetoresistive materials on the facet. Although FIG. 12B shows one facet but more facets would be adopted in order to give better rounded profile hence better magnetic performance. Furthermore, the corner portion C of the trench T may have a concave dent instead of a facet as shown in FIG. 12B*. The corner portion C of the trench T may have any profile as long as this profile would facilitate redirecting/guiding a magnetic field or a magnetic flux substantially perpendicular to the substrate 100 and/or the horizontal magnetoresistive layer 2000. For example, in order to form a facet as shown in FIG. 12B, after the trench T is formed within an inter-metal dielectric (ILD) layer, one may use a patterned mask such as patterned photoresist or patterned dielectric mask to cover areas other than the trench corner C while expose the trench corner C, then an dry or wet etching is performed to redress the profile of the trench corner C. In this case, the inter-metal dielectric (ILD) layer forming the trench corner C is redressed.

In the embodiment of FIG. 12A, the downward trench T has a width W and the sidewall of the downward trench T on which the straight part of the nonparallel magnetoresistive layer 3100 is disposed forms an angle $\alpha$ with respect to the bottom of trench T (to substrate 100). The straight parts of the nonparallel magnetoresistive layer 3100 and the optional opposite layer 3200 are disposed on the sidewalls of the downward trench T and do not extend onto the bottom of the downward trench T. However, in another embodiment of the present invention, it is possible for the straight parts of the nonparallel magnetoresistive layer 3100 and the optional opposite layer 3200 extend onto the bottom of the downward trench T to cover the bottom of width W completely as shown in FIG. 12C. In this case, a bottom magnetoresistive layer 3500 is formed integrally with the straight parts of the nonparallel magnetoresistive layer 3100 and the optional opposite layer 3200. Or, as in still another embodiment of the present invention, the straight parts of the nonparallel magnetoresistive layer 3100 and the optional opposite layer 3200 may extend onto the bottom of the downward trench T to cover the bottom of width W partially and leave the bottom partially uncovered as shown in FIG. 12D. In such a case, two bottom magnetoresistive layers 3501 and 3502 may be formed integrally with the straight parts of the nonparallel magnetoresistive layer 3100 and the optional opposite layer 3200 respectively. The coverage of the bottom may vary based on design needs. Aside from that, the angle $\alpha$ may vary based on design needs as well. The angle $\alpha$ is preferably equal to or less than 90 degree, as shown in the embodiment of FIG. 12D.

Figure 13:
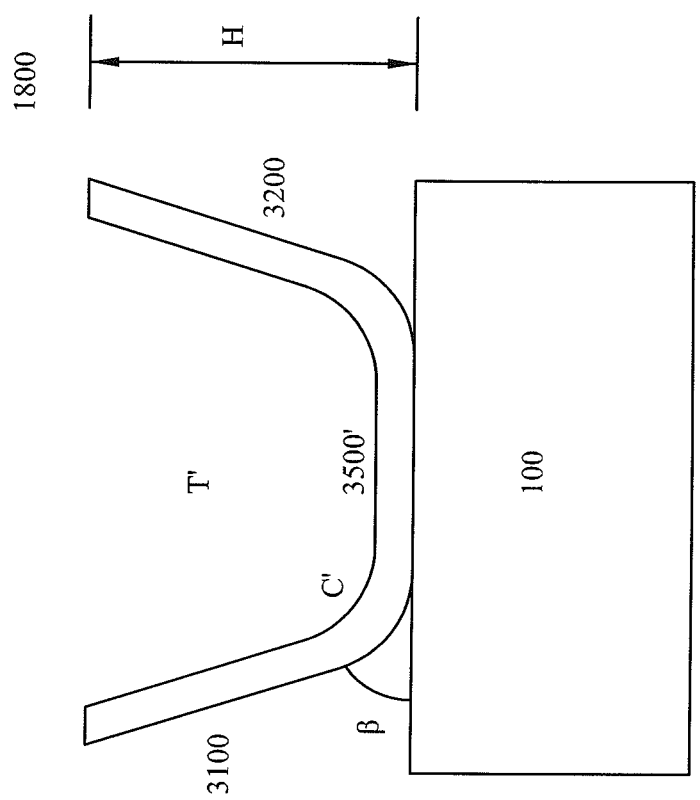
FIG. 13 shows a cross section view according to a modified embodiment of the present invention.

Please refer to FIG. 13 now, which shows a cross sectional view according to a modified embodiment of the present invention. In this modified embodiment, a magnetoresistive sensing component 1800 also comprises at least one trench. Component 1800 could also be used in all xMR devices. The term "xMR devices" shall include all known magnetoresistive devices using at least one magnetoresistive material, such as AMR (anisotropic magnetoresistive) devices, GMR (giant magnetoresistive) devices, CMR (colossal magnetoresistive) devices, TMR (tunnel magnetoresistive) devices, or EMR (extraordinary magnetoresistive) devices. The term "magnetoresistive material/layer" here means a material/layer whose resistance would change according to a change of an external magnetic field. The at least one magnetoresistive material comprises but is not limited to a ferromagnet material, an antiferromagnet material, a nonferromagnet material and a tunneling oxide or any combination thereof. Specifically, the at least one magnetoresistive material comprises but is not limited to permolloy, iron/chromium alloy (Fe/Cr), cobalt/iron alloy (Co/Fe), cobalt/copper alloy (Co/Cu), cobalt/iron/copper alloy (Co/Fe/Cu), nickel/iron alloy (Ni/Fe), Iron/manganese alloy (Fe/Mn), nickel/manganese alloy (Ni/Mn), an alloy of at least two metal elements or any combination thereof.

The magnetoresistive sensing component 1800 primarily comprises a horizontal magnetoresistive layer 3500', an upward trench T', a nonparallel magnetoresistive layer 3100, an optional opposite layer 3200. The horizontal magnetoresistive layer 3500' is disposed on the bottom of the upward trench T' above the substrate 100 and substantially parallel to the substrate 100. The term "upward" is used here because trench sidewalls and the nonparallel magnetoresistive layer 3100 extend upward from the horizontal magnetoresistive layer 3500' instead of extending downward from the horizontal magnetoresistive layer 2000. The term "substantially" here represents deviations caused by process tolerances such as thickness ranges of under layers, etching non-uniformity, CMP (chemical mechanical polishing) dishing effect or micro-loading effect. The substrate 100 may be a silicon substrate, a silicon-on-insulator substrate, a glass substrate, a composite substrate or a silicon substrate with active devices and interconnects thereon.

In this modified embodiment, the horizontal magnetoresistive layer 2000 is omitted and its function is rendered by the horizontal magnetoresistive layer 3500'. Therefore, the nonparallel magnetoresistive layer 3100 extends upwards from a first side of the horizontal magnetoresistive layer 3500' and physically connected thereto, so as to redirect/guide a magnetic field or a magnetic flux substantially perpendicular to the substrate 100 to the horizontal magnetoresistive layer 3500'. Similarly, the horizontal magnetoresistive layer 3500' and the nonparallel magnetoresistive layer 3100 may be formed from the same magnetoresistive material/materials in one structure, or may be formed from the same or different magnetoresistive materials separately into physically connected separate structures. Even when the horizontal magnetoresistive layer 2000 and the nonparallel magnetoresistive layer 3500' use the same material/materials and are formed in one structure, different thicknesses can be adopted according to design requirements or different thicknesses may be obtained due to process capabilities. It is worth mentioning that the nonparallel magnetoresistive layer 3100 is composed of a straight part and a curved part on the corner portion C' of trench T'. The curved part of the nonparallel magnetoresistive layer 3100 is well rounded as shown in FIG. 13 to optimize magnetic hysteresis loop of a magnetoresistive device comprising thereof hence performance of such a device. Generally, tuning curvature of the corner portion C' of the trench T' would also change the magnetic hysteresis loop. The more linear the magnetic hysteresis loop is, the better performance is obtained. The rounded profile of corner portion C' of the trench T' may also be obtained through processes mentioned above.

The upward trench T' has a height H and the sidewall of the upward trench T' on which the straight part of the nonparallel magnetoresistive layer 3100 is disposed forms an angle $\beta$ with respect to the bottom of trench T' (to the substrate 100). The straight part of the nonparallel magnetoresistive layer 3100 may extend from the corner C' of the trench T' to the upper limit of the height H as shown in FIG. 13. Or, the straight part of the nonparallel magnetoresistive layer 3100 may extend from the corner C' of the trench T' to a mid point of the height H. The coverage of the sidewall of the trench T' by the straight part of the nonparallel magnetoresistive layer 3100 may vary based on design need and/or manufacturing concerns. The angle $\beta$ is preferably equal to or less than 90 degree.

Figure 14A:
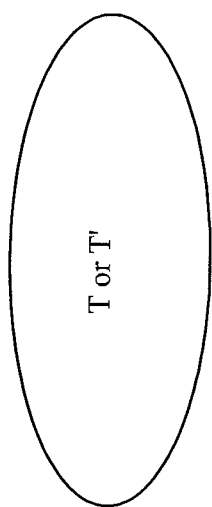
FIGS. 14A-C show the top views of different shapes of the trench according to embodiments of the present invention.
Figure 14B:
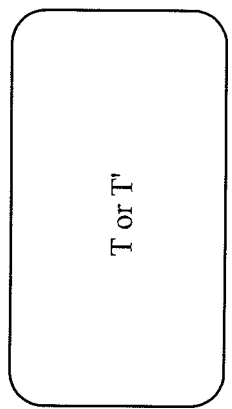
Figure 14C:
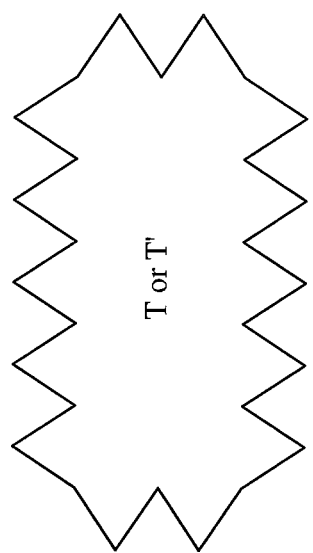

Please refer to FIGS. 14A-C now, which show the top views of different shapes of the trench according to embodiments of the present invention. Generally, when viewed from top view, the downward trench T and the upward trench T' may have any shapes such as oval shape shown in FIG. 14A, rectangular shape with rounded corners shown in FIG. 14B, and rectangular shape with at least one jagged long side shown in FIG. 14C. The present invention is not limited thereto, the shape could be shapes with rounded corners and/or jagged sides and the shape could be symmetrical or asymmetrical shapes or random shapes. Similarly, as mentioned earlier, the downward trench T may comprise a plurality of discrete trenches and each discrete trench may have any shapes.

Figure 15:
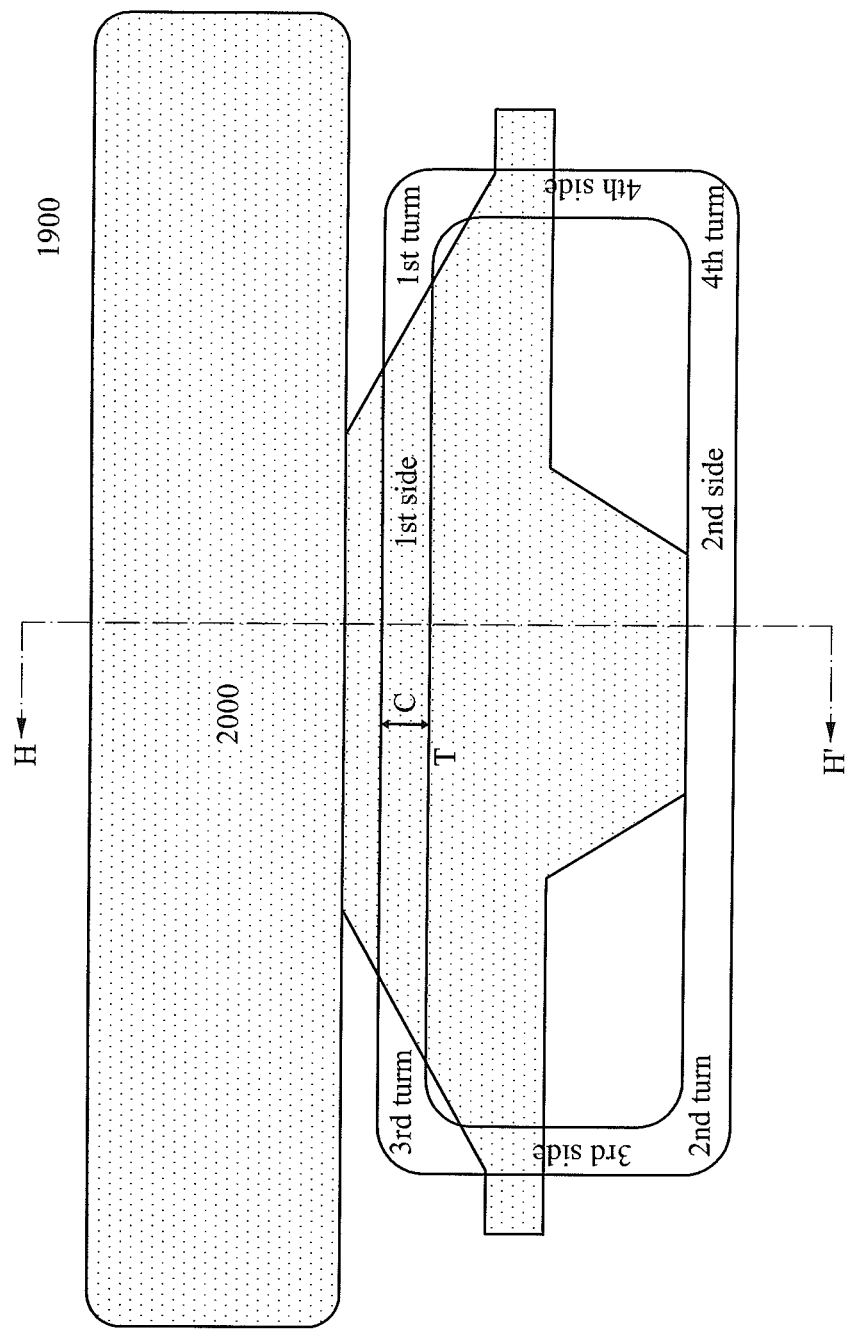
FIG. 15 shows the top view of a magnetoresistive sensing component according to a modified embodiment of the present invention, wherein this component comprises at least one trench.

Please refer to FIG. 15 now. FIG. 15 shows the top view of the top view of a magnetoresistive sensing component 1900 according to a modified embodiment of the present invention, wherein this component 1900 comprises at least one trench T. This modified embodiment of FIG. 15 is different from the embodiment shown in FIG. 11 in the coverage of magnetoresistive material within the trench T and around the trench T. When the trench T has a rectangle shape viewed in top view, it has two opposite long sides (1st side and 2nd side), two opposite short sides (3rd side and 4th side), four turns between adjacent sides (1st, 2nd, 3rd and 4th turns) and a bottom (shown as the area within the inner rectangle). The corner C of each side and each turn is shown in FIG. 15 as the area between two rectangles. However, the corner C should be defined by cross sectional view as the contour between the horizontal contour and the vertical contour (please see FIGS. 12A-12D and FIG. 16). The 1st side abuts the horizontal magnetoresistive layer 2000. As shown in the top view of FIG. 15, the magnetoresistive material forming the horizontal magnetoresistive layer 2000 extends to cover a portion of the trench T. Specifically, the coverage of magnetoresistive material for each side, each turn and bottom of the trench T viewed in top view and each corner of the trench T viewed in cross sectional view may be designed separately and independently in order to achieve optimum magnetic sensing performance. They could be fully covered by magnetoresistive material (such as the extension of the horizontal magnetoresistive layer 2000), partially covered or completely uncovered. Here, "a side is covered by magnetoresistive material" means the trench sidewall of that side is covered by magnetoresistive material. For example, in the present embodiment, the magnetoresistive material forming the horizontal magnetoresistive layer 2000 extends to partially cover the 1st side (trench sidewall of the 1st side), the corner of the 1st side, the 2nd side (trench sidewall of the 2nd side), the 3rd side (trench sidewall of the 3rd side), the corner of the 3rd side, the 4th side (trench sidewall of the 4th side) and the corner of the 4th side while it leaves all the turns (sidewall of all the turns) and the corners of all the turns and the corner of the 2nd side completely uncovered. The trench bottom may be fully covered, or partially covered as shown in FIG. 15 or completely uncovered. Furthermore, the magnetoresistive material (such as the extension of the horizontal magnetoresistive layer 2000) could extend beyond the trench T as shown at the 3rd side and the 4th side. That is, the magnetoresistive material could extend to cover a horizontal contour abutting a trench corner. No matter the shapes of the trench T viewed in top view, the coverage of magnetoresistive material for each side, each turn, each corner and bottom of the trench T having a bottom, multiple sides and multiple turns joining adjacent sides may be designed separately and independently. This result can be obtained through a specific layout design and photoresist patterns formed in a lithography process. Specifically, the regions to be covered by the magnetoresistive material should be covered and protected by photoresist patterns while the regions to be uncovered by the magnetoresistive material should be exposed by photoresist patterns and attacked by dry or wet etching.

Figure 16:
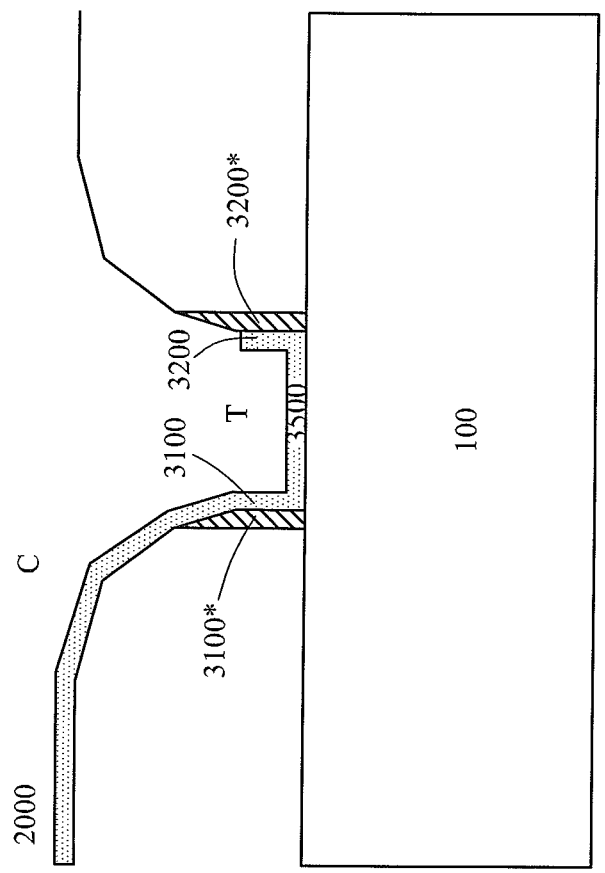
FIG. 16 shows the cross section view taken along line H-H' of FIG. 15.

Please refer to FIG. 16 now. FIG. 16 shows the cross sectional view taken along line H-H' of FIG. 15. This modified embodiment of FIG. 16 is different from the embodiment shown in FIG. 12C in its nonparallel magnetoresistive layer. In this modified embodiment, the nonparallel magnetoresistive layer comprises a front part 3100 and a back part 3100*. As defined earlier, the front part 3100 is composed of a straight part and a curved part. The front part 3100 is an extension of the horizontal magnetoresistive layer 2000, so the front part 3100 and the horizontal magnetoresistive layer 2000 have substantially the same thickness and are in one structure. The back part 3100* is a separate structure from the front part 3100 but may be formed from the same magnetoresistive material used by the front part 3100. Alternatively, the back part 3100* may be formed from a different magnetoresistive material. The existence of the back part 3100* of the nonparallel magnetoresistive layer makes the magnetoresistive sensing component 1900 have thicker nonparallel magnetoresistive layer on the trench sidewall and thinner horizontal magnetoresistive layer 2000. Furthermore, a bottom magnetoresistive layer 3500 is formed integrally with the front part 3100 of the nonparallel magnetoresistive layer. Similarly, the opposite layer comprises a front part 3200 and a back part 3200*. The front part 3200 is an extension of the bottom magnetoresistive layer 3500 while the back part 3200* is a separate structure from the front part 3200 and is formed with the same magnetoresistive material used by the back part 3100*. Although the cross sectional view taken along the other direction perpendicular to line H-H' is not shown, a person skilled in the art, from FIG. 11, could infer there are a front part 3300 and a back part 3300* of the connecting layer on the sidewall of the 3rd side (not shown) and a front part 3400 and a back part 3400* of the connecting layer on the sidewall of the 4th side (not shown). All the back parts 3100*, 3200*, 3300* and 3400* (3300* and 3400* are not shown) may abut each other to form an integral and contiguous structure. However, the front parts 3100, 3200, 3300 and 3400 (3300 and 3400 are not shown) could abut each other or separate from each other depending on the coverage of the magnetoresistive material for each side and each turn.

The manufacturing process used to form the magnetoresistive sensing component 1900 may comprise: 1) forming a trench T in an inter-metal dielectric layer, this trench T may have any shapes and any sidewall angle with respect to the substrate, this trench could be a single trench or composed of multiple discrete smaller trenches; 2) forming a first layer of magnetoresistive layer blanketly; 3) performing an etching anisotropically so the first layer of magnetoresistive layer only remains on the sidewall of the trench as spacers (back part 3100* on the sidewall of the 1st side, back part 3200* on the sidewall of the 2nd side and back parts 3300* and 3400* on the sidewalls of the 3rd side and the 4th side (not shown) abutting each other); 4) forming a second layer of magnetoresistive layer blanketly; and 5) optionally performing a lithography process and at least one etching process to remove the unwanted second layer of magnetoresistive layer and form the horizontal magnetoresistive layer 2000, the front part 3100 of nonparallel magnetoresistive layer, the front part 3200 of the opposite layer, the bottom layer 3500 and the front parts 3300 and 3400 of the optional connecting layers (not shown).

It is worth noting that in the step 3) the spacers formed by the first magnetoresistive layer can have different heights and/or thicknesses. The longer the etching is, the shorter and thinner the spacer is. It is also worth noting that in the step 3) a different approach could be adopted to achieve a similar result. For example, a lithography process may be performed to cover the trench sidewalls then an etching process is performed to completely remove or reduce thickness of the first magnetoresistive layer in the areas other than trench sidewalls such as the trench bottom. By doing so, the resulted nonparallel magnetoresistive layer (combination of the front part 3100 and the back part 3100*) would have a thicker thickness.

It is also worth noting that in the step 5) the covering scope of the patterned photoresist of the lithography process may be adjusted. In the exemplary embodiment shown in FIGS. 15 and 16, the upper trench (viewed from top view) is almost completely protected by the patterned photoresist (not shown) while some parts of the bottom trench (viewed from top view) are exposed from the patterned photoresist (not shown), so the second magnetoresistive layer of the upper trench (viewed from top view) almost completely remains while the second magnetoresistive layer of some parts of the bottom trench (viewed from top view) are removed. However, it is possible to adjust the covering scope of the patterned photoresist so different fractions of the trench can be covered by the patterned photoresist hence different fractions of the trench sidewall having the second magnetoresistive layer.

The present invention provides a magnetoresistive component comprising a combination of at least one horizontal magnetoresistive layer and at least one nonparallel magnetoresistive layer to improve magnetic performance and compactness of magnetoresistive devices having the same.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetoresistive component, comprising: a horizontal magnetoresistive layer, disposed above a surface of a substrate and parallel to the surface, having a first side and a second side opposite the first side, along its extending direction; a nonparallel magnetoresistive layer not parallel to the surface of the substrate and physically connected to the horizontal magnetoresistive layer at the first side of the horizontal magnetoresistive layer.

2. The magnetoresistive component according to claim 1, wherein the resistance of the horizontal magnetoresistive layer and the nonparallel magnetoresistive layer would change according to a change of an external magnetic field.

3. The magnetoresistive component according to claim 1, wherein the horizontal magnetoresistive layer and the nonparallel magnetoresistive layer comprise one of a ferromagnet material, an antiferromagnet material, a nonferromagnet material and a tunneling oxide or any combination thereof.

4. The magnetoresistive component according to claim 1, wherein the nonparallel magnetoresistive layer extends upwards or downwards from the first side of the horizontal magnetoresistive layer.

5. The magnetoresistive component according to claim 1, wherein the nonparallel magnetoresistive layer is a long strip or comprises multiple discrete sub-portions.

6. The magnetoresistive component according to claim 1, wherein the nonparallel magnetoresistive layer is composed of a straight part and a curved part physically connecting to the horizontal magnetoresistive layer.

7. The magnetoresistive component according to claim 1, wherein the nonparallel magnetoresistive layer is composed of a straight part and a faceted part physically connecting to the horizontal magnetoresistive layer.

8. The magnetoresistive component according to claim 1, further comprising another nonparallel magnetoresistive layer extending upwards or downwards from the second side of the horizontal magnetoresistive layer and physically connected thereto.

9. The magnetoresistive component according to claim 1, further comprising: a downward trench, wherein the nonparallel magnetoresistive layer is disposed on a sidewall of the downward trench and extends downward from the horizontal magnetoresistive layer.

10. The magnetoresistive component according to claim 9, wherein the sidewall of the downward trench forms an angle with respect to the surface of the substrate and the angle is equally to or less than 90 degree.

11. The magnetoresistive component according to claim 9, further comprising: a bottom magnetoresistive layer disposed on a bottom of the downward trench, wherein this bottom magnetoresistive layer is physically connected to the nonparallel magnetoresistive layer.

12. The magnetoresistive component according to claim 11, wherein the bottom magnetoresistive layer completely covers the bottom of the downward trench.

13. The magnetoresistive component according to claim 11, wherein the bottom magnetoresistive layer partially covers the bottom of the downward trench and leaves the bottom of downward trench partially uncovered.

14. The magnetoresistive component according to claim 11, wherein a shape of the downward trench viewed in top view is oval shape, rectangular shape with rounded corners or rectangular shape with at least one jagged side.

15. The magnetoresistive component according to claim 1, further comprising: an upward trench, wherein the horizontal magnetoresistive layer is disposed on a bottom of the upward trench while the nonparallel magnetoresistive layer is disposed on a sidewall of the upward trench and extends upwards from the first side of the horizontal magnetoresistive layer.

16. The magnetoresistive component according to claim 15, wherein the sidewall of the upward trench forms an angle with respect to the surface of the substrate and the angle is equally to or less than 90 degree.

17. The magnetoresistive component according to claim 15, further comprising: another nonparallel magnetoresistive layer, wherein the another nonparallel magnetoresistive layer is disposed on another sidewall of the upward trench and extends upwards from the second side of the horizontal magnetoresistive layer.

18. The magnetoresistive component according to claim 15, wherein a shape of the upward trench viewed in top view is oval shape, rectangular shape with rounded corners or rectangular shape with at least one jagged side.

19. The magnetoresistive component according to claim 1, further comprising: a first downward trench at the first side of the horizontal magnetoresistive layer and a second downward trench at the second side of the horizontal magnetoresistive layer; another nonparallel magnetoresistive layer physically connected to the horizontal magnetoresistive layer, wherein the nonparallel magnetoresistive layer is disposed on a sidewall of the first downward trench and extends downwards from the first side while the another nonparallel magnetoresistive layer is disposed on a sidewall of the second downward trench and extends downwards from the second side.

20. The magnetoresistive component according to claim 1, wherein a thickness of at least a portion of the nonparallel magnetoresistive layer on the sidewall of the downward or upward trench is thicker than that of the horizontal magnetoresistive layer.

21. The magnetoresistive component according to claim 20, wherein the nonparallel magnetoresistive layer on the sidewall of the downward or upward trench comprises a back part formed as a spacer on the sidewall and a front part as an extension of the horizontal magnetoresistive layer.

22. The magnetoresistive component according to claim 1, further comprising: a downward trench having a bottom, multiple sides and multiple turns joining adjacent sides, wherein each of the bottom, sidewalls of the multiple sides and sidewalls of the multiple turns is designed to be covered, partially covered or uncovered by an extension of the horizontal magnetoresistive layer separately and independently.

23. A xMR device comprising a magnetoresistive component, the magnetoresistive component comprising: a horizontal magnetoresistive layer, disposed above a surface of a substrate and substantially parallel to the surface, having a first side and a second side opposite the first side, along its extending direction; a nonparallel magnetoresistive layer not parallel to the surface of the substrate and physically connected to the horizontal magnetoresistive layer at the first side of the horizontal magnetoresistive layer.

* * * * *